(12) United States Patent
Ando et al.

(10) Patent No.: US 6,552,373 B2
(45) Date of Patent: Apr. 22, 2003

(54) HETERO-JUNCTION FIELD EFFECT TRANSISTOR HAVING AN INTERMEDIATE LAYER

(75) Inventors: Yuji Ando, Tokyo (JP); Hironobu Miyamoto, Tokyo (JP); Naotaka Iwata, Tokyo (JP); Koji Matsunaga, Tokyo (JP); Masaaki Kuzuhara, Tokyo (JP); Kensuke Kasahara, Tokyo (JP); Kazuaki Kunihiro, Tokyo (JP); Yuji Takahashi, Tokyo (JP); Tatsuo Nakayama, Tokyo (JP); Nobuyuki Hayama, Tokyo (JP); Yasuo Ohno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/818,587

(22) Filed: Mar. 28, 2001

(65) Prior Publication Data

US 2001/0040247 A1 Nov. 15, 2001

(30) Foreign Application Priority Data

Mar. 28, 2000 (JP) .......................................... 2000-88973

(51) Int. Cl.[7] ........................ H01L 31/072; H01L 31/12; H01L 33/00; H01L 31/107; H01L 31/109
(52) U.S. Cl. ........................ 257/192; 257/12; 257/15; 257/20; 257/85; 257/94; 257/183; 257/184; 257/185; 257/187; 257/190; 257/192; 257/193; 257/194; 257/195; 257/196; 257/201
(58) Field of Search ................................ 257/192–196, 257/185, 184, 187, 190, 201, 183, 12, 15, 20, 85, 94

(56) References Cited

U.S. PATENT DOCUMENTS

| | | | | |
|---|---|---|---|---|
| 5,670,798 A | * | 9/1997 | Shetzina ..................... 257/96 |
| 5,679,965 A | * | 10/1997 | Schetzina ................... 257/103 |
| 5,739,554 A | * | 4/1998 | Edmond et al. ............. 257/103 |
| 5,880,486 A | * | 3/1999 | Nakamura et al. ............ 257/96 |
| 6,031,858 A | * | 1/2000 | Hatakoshi et al. ............ 372/46 |
| 6,064,082 A | * | 5/2000 | Kawai et al. ................ 257/192 |
| 6,274,893 B1 | * | 8/2001 | Igarashi et al. .............. 257/192 |
| 6,285,698 B1 | * | 9/2001 | Romano et al. ............... 372/46 |
| 6,316,793 B1 | * | 11/2001 | Sheppard et al. ............ 257/103 |
| 6,323,053 B1 | * | 11/2001 | Nishikawa et al. ........... 438/46 |
| 2001/0017370 A1 | * | 8/2001 | Sheppard et al. ............. 257/24 |

\* cited by examiner

*Primary Examiner*—Amir Zarabian
*Assistant Examiner*—Ida M. Soward
(74) *Attorney, Agent, or Firm*—Sughrue Mion, PLLC

(57) ABSTRACT

A hetero-junction FET has an intermediate layer including n-type-impurity doped layer between an electron supply layer and an n-type cap layer. The intermediate layer cancels the polarized negative charge generated between the electron supply layer and the n-type cap layer by ionized positive charge, thereby reducing the barrier against the electrons and source/drain resistance.

20 Claims, 14 Drawing Sheets

HETERO-JUNCTION FIELD EFFECT TRANSISTOR HAVING AN INTERMEDIATE LAYER

BACKGROUND OF THE INVENTION (a) Field of the Invention

The present invention relates to a hetero-junction field effect transistor (hereinafter abbreviated as HJFET) having an intermediate layer and, more particularly, to a HJFET having higher output power and excellent low-noise performance.

(b) Description of the Related Art

FIG. 1 schematically shows a conventional HJFET. Such a structure of HJFET is reported, for example, by T. Egawa, et al. on International Electron Device Meeting Digest, 1999.

The HJFET has a buffer layer 201 made of gallium nitride (GaN), a GaN channel layer 202, an AlGaN electron supply layer 203 and an n-type GaN cap layer 205 which are stacked consecutively on a sapphire substrate 200. A source electrode 8S and a drain electrode 8D are formed on the n-type GaN cap layer 205 while making an ohmic contact therewith. A gate electrode 9 is formed in contact with the AlGaN layer 203 while making a Schottky contact therewith, in a recess 17 which is formed by removing part of the n-type GaN cap layer 205 and the AlGaN electron supply layer 203.

In the hetero-structure described above, it is known that polarized charges are generated due to piezoelectric polarization effect because the lattice constant ('a' axis) of AlGaN is smaller than that of GaN, and also due to the spontaneous polarization effect because the atomic arrangement of AlGaN deviates from the ideal arrangement even in the state free of strain. FIG. 1B shows the charge distribution between the channel layer 202 and the cap layer 205 of the HJFET of the prior art. During Ga surface growth, polarized positive charge $+\sigma_{POL}$ is generated in channel side hetero-interface and polarized negative charge $-\sigma_{POL}$ is generated in cap side hetero-interface. As a result, two-dimensional electrons are induced resulting in the generation of negative charge $-\sigma_{2DEG}$ in the channel side hetero-interface, while a depletion layer is formed resulting in the generation of positive charges $+\sigma_{DON}$ in the cap layer 205.

FIG. 1C is an energy band diagram showing the energy distribution in the conduction band corresponding to FIG. 1B, in which energy is plotted along the ordinate and depth is plotted along the abscissa. Quantum well is formed in the channel side hetero-interface so that two-dimensional electrons are generated therein, while the depletion layer is formed in the cap side hetero-interface so that a potential barrier against electrons is formed therein.

A numerical computation shows that the magnitude of the potential barrier formed in the cap side hetero-interface is 0.9 eV when the value of Al proportion y in the AlGaN layer 203 is 0.2, and reaches 3 eV when y is 0.4. Due to the effect of the potential barrier, the probability of tunneling of electrons to pass between the cap layer 205 and the channel layer 202 decreases. Consequently, when an ohmic electrode is formed through contact with the GaN layer 205, contact resistance increases, thereby making it impossible to decrease the source resistance and the drain resistance sufficiently. Thus there are such problems that the power gain decreases, power delivering efficiency for a large signal amplitude decreases, and the noise factor increases.

SUMMARY OF THE INVENTION

With the background described above, it is an object of the present invention to provide a heterojunction field effect transistor which has lower source resistance, lower drain resistance, higher output power and excellent noise characteristic.

The present invention provides in a first aspect thereof, a hetero-junction field effect transistor (HJFET) including a substrate, a layer structure including an $In_xGa_{1-x}N$ ($0 \leq x \leq 1$) channel layer, an $Al_yGa_{1-y}N$ ($0 < y \leq 1$) electron supply layer, at least one intermediate layer and an n-type GaN cap layer consecutively formed on the substrate, a gate electrode disposed in contact with the electron supply layer, and source and drain electrodes disposed in contact with the n-type cap layer, the at least one intermediate layer being formed as a single n-type-impurity doped layer or a plurality of stacked layers including at least one n-type-impurity doped layer.

The present invention provides, in a second aspect thereof, a hetero-junction field effect transistor (HJFET) including a substrate, a layer structure including an $In_xGa_{1-x}N$ ($0 \leq x \leq 1$) channel layer, an $Al_yGa_{1-y}N$ ($0 < y \leq 1$) electron supply layer, at least one intermediate layer and an n-type $In_uGa_{1-u}N$ cap layer consecutively formed on the substrate, a gate electrode disposed in contact with the electron supply layer, and source and drain electrodes disposed in contact with the n-type cap layer, the at least one intermediate layer being formed as a single n-type-impurity doped layer or a plurality of stacked layers including at least one n-type-impurity doped layer.

In accordance with the HJFET of the first and second aspects of the present invention, the intermediate layer cancels the polarized negative charges generated between the electron supply layer and the n-type cap layer by ionized positive charges, whereby the hetero-junction field effect transistor of the present invention has the advantages of reduction of the source/drain resistance, a higher output power and an excellent noise characteristic.

The above and other objects, features and advantages of the present invention will be more apparent from the following description, referring to the accompanying drawings.

DETAILED DESCRIPTION OF THE PREFERRED EMBODIMENTS

Now the present invention will be described in detail below by way of preferred embodiments thereof.

First Embodiment

Figure 2A:
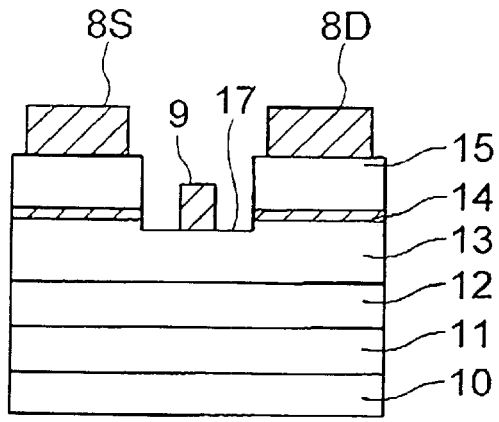
FIG. 2A schematically shows an HJFET according to a first embodiment of the present invention in a cross section thereof.

FIG. 2A schematically shows the structure of a HJFET according to a first embodiment of the present invention in a cross section thereof. The HJFET has an undoped aluminum nitride (AlN) buffer layer 11, an undoped GaN channel layer 12, an n-type AlGaN electron supply layer 13, an Si monoatomic layer 14 and an n-type GaN cap layer 15 which are stacked sequentially on a sapphire substrate 10.

The Si monoatomic layer 14 constitutes an intermediate layer. Two-dimensional electron gas is generated in the vicinity of the interface between the GaN channel layer 12 and the AlGaN electron supply layer 13. A source electrode 8S and a drain electrode 8D are formed on the n-type GaN cap layer 15 while making an ohmic contact therewith. A gate electrode 9 is formed on the n-type AlGaN electron supply layer 13 while making a Schottky contact therewith, in a recess 17 which is formed by removing part of the semiconductor layers 15, 14, 13.

In the HJFET of this embodiment, the source electrode 8S and the drain electrode 8D are isolated from each other by a depletion layer formed from the gate electrode 9 into the n-type AlGaN electron supply layer 13 under the state of a negative voltage being applied to the gate electrode 9, while current flowing between the source electrode 8S and the drain electrode 8D is controlled by suppressing the extent of the depletion layer under the state of a positive voltage being applied to the gate electrode 9. This operation is carried out similarly in the constitutions of the HJFET of the second and subsequent embodiments.

The HJFET having the constitution described above is manufactured as follows. First, the following layers having the specified thickness are formed successively on the (100) sapphire substrate 10 in the procedures #1 through #5 by using, for example, a molecular beam epitaxial technique (MBE).

1 Undoped AlN buffer layer 11: 20 nm
2 Undoped GaN channel layer 12: 2 $\mu$m
3 n-type $Al_{0.2}Ga_{0.8}N$ layer (n-type impurity concentration $2 \times 10^{18}/cm^3$) 13: 40 nm
4 Si monoatomic layer (n-type impurity concentration $1.1 \times 10^{13}/cm^3$) 14
5 n-type GaN layer (n-type impurity concentration $5 \times 10^{18}/cm^3$) 15: 50 nm While AlGaN and GaN have different lattice constants, the thickness 40 nm of the $Al_{0.2}Ga_{0.8}N$ layer 13 is below the critical thickness for the occurrence of dislocation.

Then inter-element isolation mesa is formed by etching away a part of the epitaxial layer until the GaN channel layer 12 is exposed. This is followed by evaporation of a metal such as Ti/Al on the n-type GaN layer 15 and alloying processing, thereby to form the source electrode 8S and the drain electrode 8D, while making an ohmic contact.

Figure 1A:
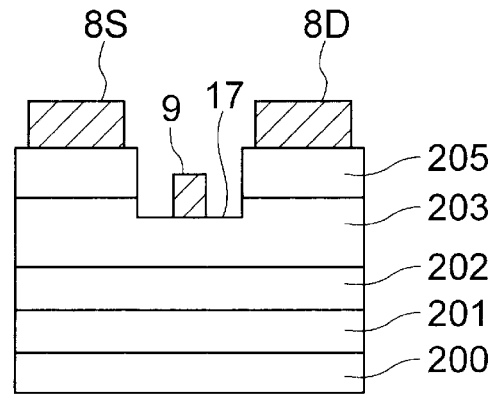
FIG. 1A schematically shows a conventional HJFET in a cross section thereof.

Last, the gate electrode 9 is formed by the evaporation of a metal such as Ni/Au on the AlGaN layer exposed by etching away part of the semiconductor layers 15, 14, 13, while making a Schottky contact. Thus the HJFET as shown in FIG. 1 is manufactured.

Figure 2B:
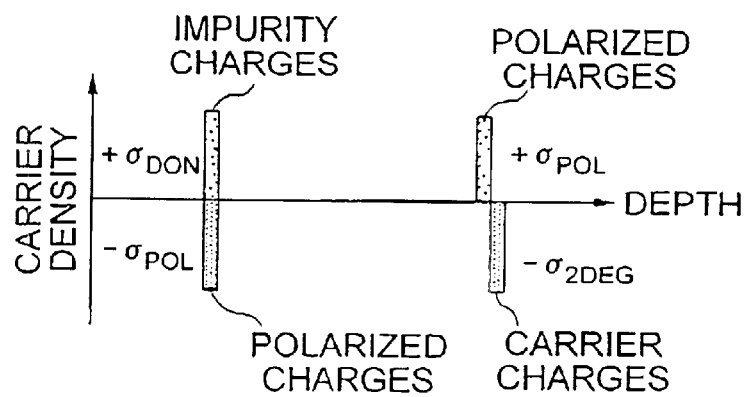
FIG. 2B shows the charge distribution between a cap layer and a channel layer, and FIG. 2C(c) shows the energy distribution in the conduction band corresponding to the graph of FIG. 2B.

FIG. 2B shows the charge distribution between the cap layer 15 and the channel layer 12 of the HJFET manufactured as described above. Positive charge $+\sigma_{POL}$ is generated in channel side hetero-interface and negative charge $-\sigma_{POL}$ is generated in cap side hetero-interface due to piezoelectric polarization effect and the spontaneous polarization effect in this embodiment Positive charge $+\sigma_{DON}$ is generated due to ionization of Si in the Si monoatomic layer 14, and negative charge $-\sigma_{2DEG}$ is generated by the two-dimensional electron gas in the channel side hetero-interface.

Figure 1B:
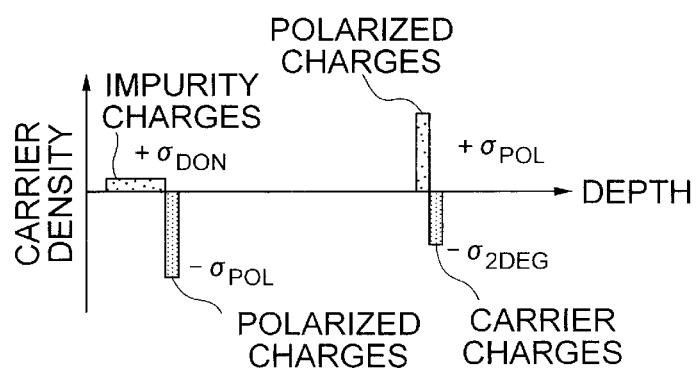
FIG. 1B shows the charge distribution between a cap layer and a channel layer.
Figure 1C:
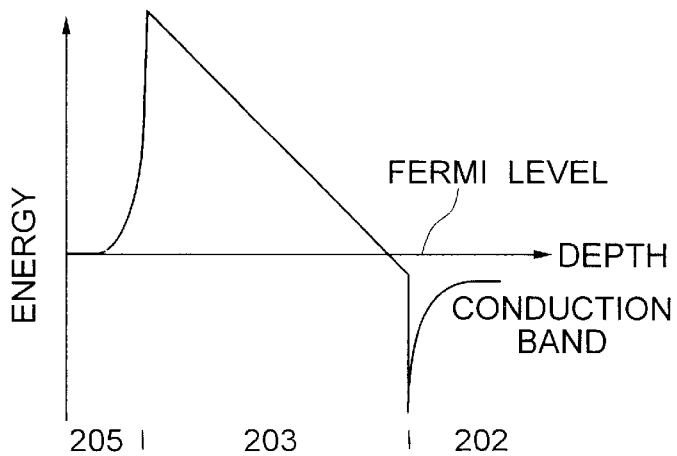
FIG. 1C shows energy distribution in the conduction band corresponding to the graph of FIG. 1B.
Figure 2C:
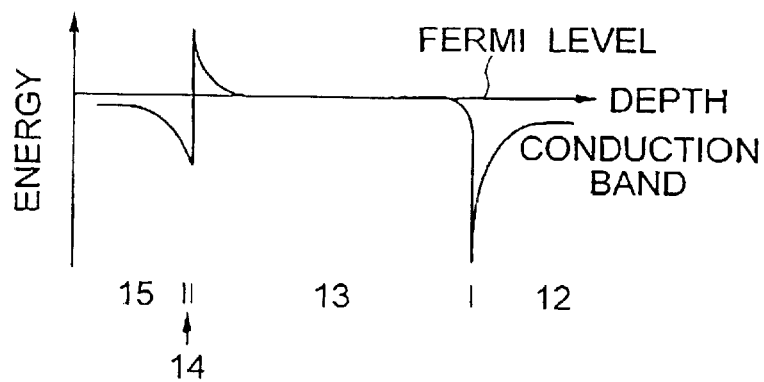

FIG. 2C is an energy band diagram showing the energy distribution in the conduction band corresponding to FIG. 1(b), in which energy is plotted along the ordinate and depth is plotted along the abscissa. Numerals 12 through 15 marked along the abscissa correspond to the numerals of the respective layers. In this embodiment, substituting the value of Al proportion y in the AlGaN layer 13, which is 0.2, to the equation $$\sigma_{POL}/q\ [\text{cm}^{-2}] = 1.16 \times 10^{13} xy^2 + 5.24 \times 10^{13} xy \quad (1)$$

yields $$\sigma_{POL}/q = 1.1 \times 10^{13}/\text{cm}^2.$$

Since $\sigma_{DON}/q$ is expressed by $$\sigma_{DON}/q = 1.1 \times 10^{13}/\text{cm}^2,$$

the polarized negative charge $-\sigma_{POL}$ is canceled out by the ionization positive charge $+\sigma_{DON}$ in the cap side hetero-interface.

As a result, the two-dimensional electron gas is generated in the cap side hetero-interface, resulting in the formation of quantum well. A numerical computation shows that the magnitude of the potential barrier formed in the cap side hetero-interface against electrons is estimated at 0.3 eV in this case. Thus, the potential barrier against electrons is lower than that of a case in which the Si monoatomic layer 14 is absent (0.9 eV), and the probability of tunneling of electrons to pass between the cap layer 15 and the channel layer 12 increases. Consequently, contact resistance between the cap layer 15 and the channel layer 12 decreases thus resulting in decrease in the source resistance and the drain resistance.

Second Embodiment

Figure 3A:
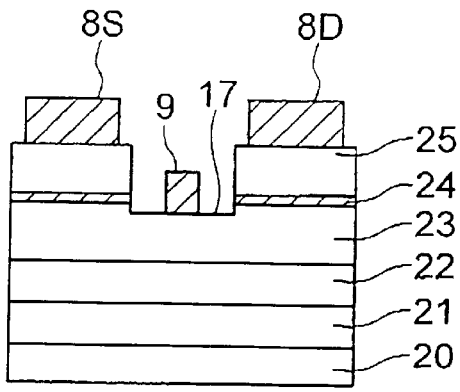
FIG. 3A schematically shows an HJFET according to a second embodiment of the present invention in a cross section thereof.

FIG. 3A schematically shows the HJFET of this embodiment. The HJFET has an undoped GaN buffer layer 21, an n-type GaN channel layer (n-type impurity concentration $5 \times 10^{17}/\text{cm}^3$, film thickness 30 nm) 22, an undoped $Al_{0.2}Ga_{0.8}N$ electron supply layer (film thickness 30 nm) 23, an n-type $Al_{0.2}Ga_{0.8}N$ layer (n-type impurity concentration $1 \times 10^{19}/\text{cm}^3$, film thickness 10 nm) 24 and an n-type GaN cap layer (n-type impurity concentration $5 \times 10^{18}/\text{cm}^3$, film thickness 50 nm) 25 which are stacked sequentially on a silicon carbide (SiC) substrate 20.

The n-type $Al_{0.2}Ga_{0.8}N$ layer 24 constitutes an intermediate layer While AlGaN and GaN have different lattice constants, the total thickness 40 nm of the $Al_{0.2}Ga_{0.8}N$ layers (23, 24) is below the critical thickness for the occurrence of dislocation. Two-dimensional electron gas is generated in the vicinity of the interface between the GaN channel layer 22 and the AlGaN electron supply layer 23. The source electrode 8S and the drain electrode 8D are formed on the n-type GaN cap layer 25 while making an ohmic contact therewith. A gate electrode 9 is formed on the AlGaN electron supply layer 23, in a recess 17 which is formed by removing part of the semiconductor layers 25, 24, 23, while making a Schottky contact therewith.

The HJFET described above is manufactured by a process similar to that of the first embodiment, after growing the epitaxial layers on the (100) SiC substrate 20 by, for example, the metal-organic vapor phase epitaxy (MOVPE) growing method.

Figure 3B:
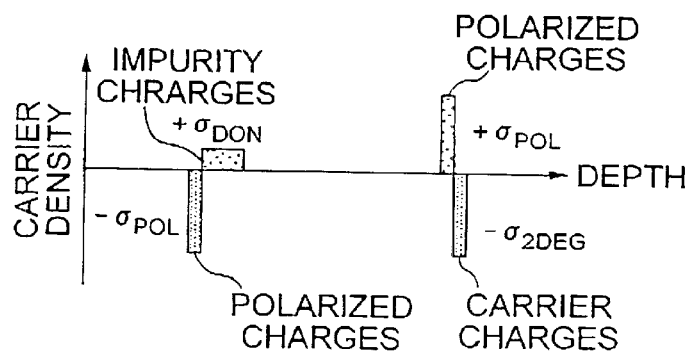
FIG. 3B shows the charge distribution between a cap layer and a channel layer.

In this embodiment, as shown in FIG. 3B, positive charge $+\sigma_{POL}$ is generated in the channel side hetero-interface and negative charge $-\sigma_{POL}$ is generated in cap side hetero-interface due to the piezoelectric polarization effect and the spontaneous polarization effect. Positive charges $+\sigma_{DON}$ is generated due to ionization of n-type impurity in the $Al_{0.2}Ga_{0.8}N$ layer 24 and negative charge $-\sigma_{2DEG}$ is generated by two-dimensional electron gas in the channel side hetero-interface.

Figure 3C:
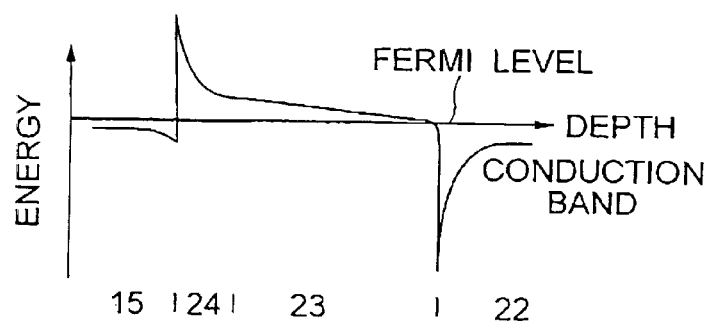
FIG. 3C shows the energy distribution in the conduction band corresponding to the graph of FIG. 3B.

Now reference is made to FIG. 3C. In this embodiment, substituting the value of Al proportion y in the AlGaN layer 23, which is 0.2, to the equation (1) yields $$\sigma_{POL}/q = 1.1 \times 10^{13}/\text{cm}^2.$$

Since $\sigma_{DON}/q$ is expressed by $$\text{ohd DON}/q = 1.1 \times 10^{19}/\text{cm}^3 \times 10\ \text{nm} = 1.1 \times 10^{13}/\text{cm}^2,$$

the polarized negative charge $-\sigma_{POL}$ is canceled out by the ionization positive charges $+\sigma_{DON}$ in the vicinity of the cap side hetero-interface. As a result, thickness of the depletion layer decreases to 10 nm which is the thickness of the $Al_{0.2}Ga_{0.8}N$ layer 24 or less, so that the probability of tunneling of electrons to pass between the cap layer 25 and the channel layer 22 increases, and effects similar to those of the first embodiment can be achieved.

Third Embodiment

Figure 4A:
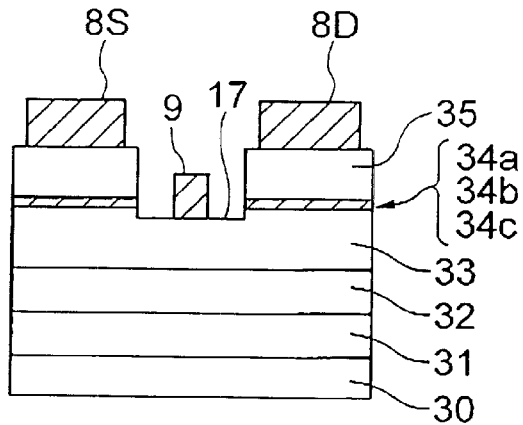
FIG. 4A schematically shows an HJFET according to a third embodiment of the present invention in a cross section thereof.

FIG. 4A schematically shows the HJFET of this embodiment. The HJFET has an undoped AlN buffer layer 31, an undoped GaN channel layer 32, an n-type $Al_{0.2}Ga_{0.8}N$ electron supply layer (n-type impurity concentration $2 \times 10^{18}/\text{cm}^3$, film thickness 30 nm) 33, an Si monoatomic layer (surface density of n-type impurity $5.5 \times 10^{12}/\text{cm}^2$) 34a, an undoped $Al_{0.1}Ga_{0.9}N$ layer (film thickness 5 nm) 34b, an Si monoatomic layer (surface density of n-type impurity $5.5 \times 10^{12}/\text{cm}^2$) 34c and an n-type GaN cap layer (n-type impurity concentration $5 \times 10^{18}/\text{cm}^3$, film thickness 50 nm) 35 which are stacked sequentially on a sapphire substrate 30.

The Si monoatomic layer 34a, the undoped $Al_{0.1}Ga_{0.9}N$ layer 34b and the Si monoatomic layer 34c constitute an intermediate layer. While AlGaN and GaN have different lattice constants, the total thickness 35 nm of the AlGaN layers (33, 34b) is below the critical thickness for the occurrence of dislocation. Two-dimensional electron gas is generated in the vicinity of the interface between the GaN channel layer 32 and the AlGaN layer 33. The source electrode 8S and the drain electrode 8D are formed on the n-type GaN cap layer 35 while making an ohmic contact therewith. A gate electrode 9 is formed on the AlGaN layer 33, in a recess 17 which is formed by removing part of the semiconductor layers 35, 34c, 34b, 34a, 33, while making a Schottky contact therewith.

The HJFET described above is manufactured by a process similar to that of the first embodiment, after growing the epitaxial layers on the (100) sapphire substrate 30 by, for example, the MBE growing method.

Figure 4B:
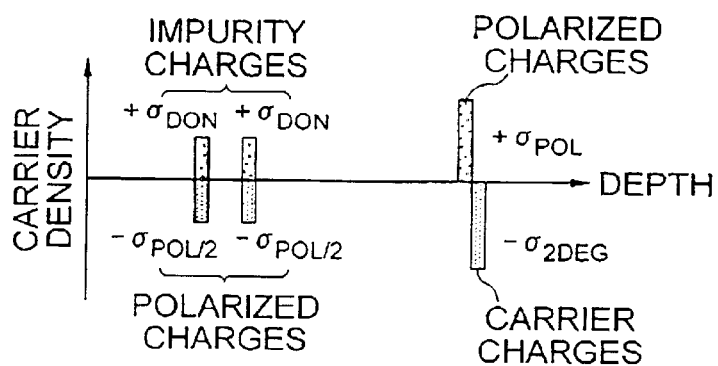
FIG. 4B shows the charge distribution between a cap layer and a channel layer.

As shown in FIG. 4B, positive charge $+\sigma_{POL}$ is generated in the interface between the $Al_{0.2}Ga_{0.8}$ N electron supply layer 33 and the GaN channel layer 32, negative charge ($\sim-\sigma_{POL}/2$) is generated in the interface between the Al$_{0.1}$Ga$_{0.9}$N layer 34b and the Al$_{0.2}$Ga$_{0.8}$N electron supply layer 33, and negative charge ($\sim-\sigma_{POL}/2$) is generated in the interface between the GaN layer 35 and the Al$_{0.1}$Ga$_{0.9}$N layer 34b due to the piezoelectric polarization effect and the spontaneous polarization effect. Positive charge +$\sigma_{DON}$ is generated due to ionization of Si in the Si monoatomic layers 34a, 34c and negative charge −$\sigma_{2DEG}$ is generated by the two-dimensional electron gas in the channel side hetero-interface.

Figure 4C:
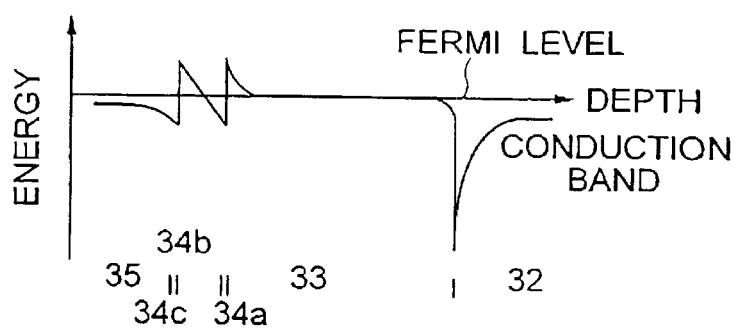
FIG. 4C shows the energy distribution in the conduction band corresponding to the graph of FIG. 4C.

Now reference is made to FIG. 4C. In this embodiment, substituting the value of Al proportion y in the AlGaN layer 33, which is 0.2, to the equation (1) yields $\sigma_{POL}/q = 1.1 \times 10^{13}/cm^2$.

Since $\sigma_{DON}/q$ is expressed by $\sigma_{DON}/q = +5.5 \times 10^{12}/cm^2$, the polarized negative charge −$\sigma_{POL}/2$ is canceled out by the ionization positive charge +$\sigma_{DON}$ in hetero-interfaces on the cap side. As a result, the two-dimensional electron gas is generated in the hetero-interfaces on the cap side, resulting in quantum well. By a numerical computation, it is shown that the magnitude of the potential barrier formed in the hetero-interfaces on the cap side against electrons is estimated at 0.1 eV in this case. Thus the potential barrier against electrons decreases, and the probability of tunneling of electrons to pass between the cap layer 35 and the channel layer 32 increases. Consequently, contact resistance between the cap layer 35 and the channel layer 32 decreases thus resulting in decrease in the source resistance and the drain resistance.

Fourth Embodiment

Figure 5A:
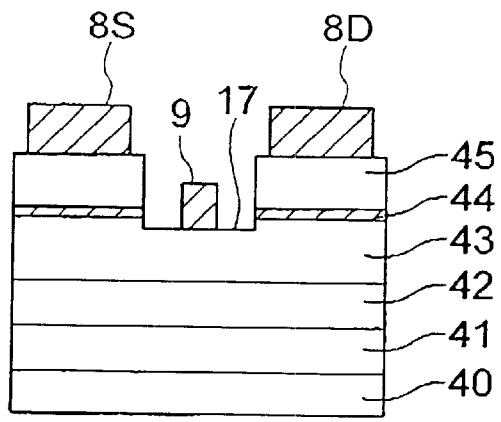
FIG. 5A schematically shows an HJFET according to a fourth embodiment of the present invention in a cross section thereof.

FIG. 5A schematically shows the HJFET of this embodiment. The HJFET has an undoped GaN buffer layer 41, an n-type GaN channel layer (n-type impurity concentration 5×10$^{17}$/cm$^3$, film thickness 30 nm) 42, an undoped Al$_{0.2}$Ga$_{0.8}$N electron supply layer (film thickness 35 nm) 43, an n-type Al$_{0.1}$Ga$_{0.9}$N layer (n-type impurity concentration 2×10$^{19}$/cm$^3$, film thickness 5.5 nm) 44 and an n-type GaN cap layer (n-type impurity concentration 5×10$^{18}$/cm$^3$, film thickness 50 nm) 45 which are stacked sequentially on an SiC substrate 40.

The n-type Al$_{0.1}$Ga$_{0.9}$N layer 44 constitutes an intermediate layer. While AlGaN and GaN have different lattice constants, the total thickness 40.5 nm of the AlGaN layers (43, 44) is below the critical thickness for the occurrence of dislocation. Two-dimensional electron gas is generated in the vicinity of the interface between the GaN channel layer 42 and the AlGaN electron supply layer 43. The source electrode 8S and the drain electrode 8D are formed on the n-type GaN cap layer 45 while making an ohmic contact therewith A gate electrode 9 is formed on the AlGaN electron supply layer 43, in a recess 17 which is formed by removing part of the semiconductor layers 45, 44, 43, while making a Schottky contact therewith.

The HJFET described above is manufactured by a process similar to that of the first embodiment, after growing the epitaxial layers on the (100) SiC substrate 40 by, for example, the MOVPE growing method.

Figure 5B:
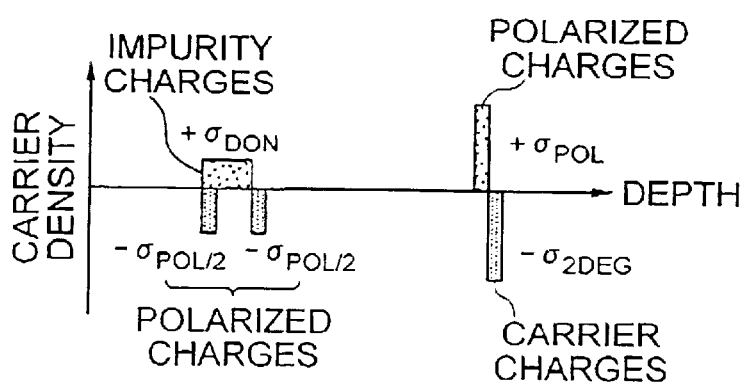
FIG. 5B shows the charge distribution between a cap layer and a channel layer.

In this embodiment, as shown in FIG. 5B, positive charge +$\sigma_{POL}$ is generated in the interface between the Al$_{0.2}$Ga$_{0.8}$N electron supply layer 43 and the GaN channel layer 42, negative charge ($\sim-\sigma_{POL}/2$) is generated in the interface between the Al$_{0.1}$Ga$_{0.9}$N layer 44 and the Al$_{0.2}$Ga$_{0.8}$N electron supply layer 43, and negative charge ($\sim-\sigma_{POL}/2$) is generated in the interface between the GaN layer 45 and the Al$_{0.1}$Ga$_{0.9}$N layer 44 due to the piezoelectric polarization effect and the spontaneous polarization effect. Positive charge +$\sigma_{DON}$ is generated due to ionization of the n-type impurity in the Al$_{0.1}$Ga$_{0.9}$N layer 44, and negative charge −$\sigma_{2DEG}$ is generated by the two-dimensional electron gas in the channel side hetero-interface.

Figure 5C:
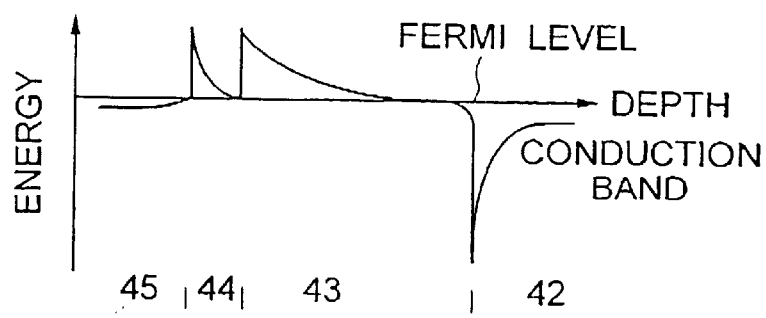
FIG. 5C shows the energy distribution in the conduction band corresponding to the graph of FIG. 5C.

Now reference is made to FIG. 5C. Total polarized negative charge generated in the hetero-interfaces on the cap side is −$\sigma_{POL}$. In this embodiment, substituting the value of Al proportion y in the AlGaN electron supply layer 43, which is 0.2, to the equation (1) yields $\sigma_{POL}/q = 1.1 \times 10^{13}/cm^2$.

Since $\sigma_{DON}/q$ is expressed by $\sigma_{DON}/q = 2 \times 10^{19}/cm^3 \times 5.5\ nm = 1.1 \times 10^{13}/cm^2$, the total polarized negative charge −$\sigma_{POL}$ is canceled out by the ionization positive charges +$\sigma_{DON}$ in the cap side hetero-interface. Thickness of the depletion layer decreases to 5.5 nm, which is the thickness of the Al$_{0.1}$Ga$_{0.9}$N layer 44, or less, so that the probability of tunneling of electrons to pass between the cap layer 45 and the channel layer 42 increases. Consequently, contact resistance between the cap layer 45 and the channel layer 42 decreases thus resulting in decrease in the source resistance and the drain resistance.

Fifth Embodiment

Figure 6A:
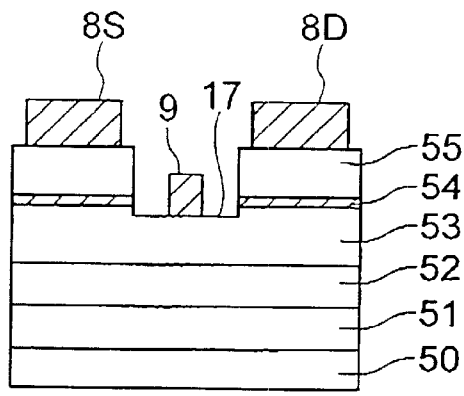
FIG. 6A schematically shows an HJFET according to a fifth embodiment of the present invention in a cross section thereof.

FIG. 6A schematically shows the HJFET of this embodiment. The HJFET has an undoped AlN buffer layer 51, an undoped GaN channel layer 52, an n-type Al$_{0.2}$Ga$_{0.8}$N electron supply layer (n-type impurity concentration 2×10$^{18}$/cm$^3$, film thickness 20 nm) 53, an n-type 5Al$_z$Ga$_{1-z}$N monotonically-graded composition layer (proportion of Al component z: 0.2→0, n-type impurity concentration 5.5× 10$^{18}$/cm$^3$, film thickness 22 nm) 54, and an n-type GaN cap layer (n-type impurity concentration 5×10$^{18}$/cm$^3$, film thickness 50 nm) 55 which are stacked sequentially on a sapphire substrate 50.

The n-type AlGaN monotonically-graded composition layer 54 constitutes an intermediate layer. While AlGaN and GaN have different lattice constants, the total thickness 42 nm of the AlGaN layers (53, 54) is below the critical thickness for the occurrence of dislocation. Two-dimensional electron gas is generated in the vicinity of the interface between the GaN channel layer 52 and the AlGaN electron supply layer 53. The source electrode 8S and the drain electrode 8D are formed on the n-type GaN cap layer 55 while making an ohmic contact therewith. A gate electrode 9 is formed on the AlGaN electron supply layer 53 while making a Schottky contact therewith, in a recess 17 which is formed by removing part of the semiconductor layers 55, 54, 53.

The HJFET described above is manufactured by a process similar to that of the first embodiment, after growing the epitaxial layers on the (100) sapphire substrate 50 by, for example, the MBE growing method.

Figure 6B:
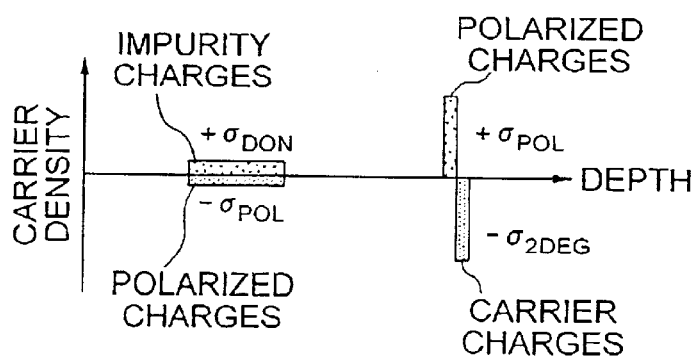
FIG. 6B shows the charge distribution between a cap layer and a channel layer.

In this embodiment, as shown in FIG. 6B, positive charge +$\sigma_{POL}$ is generated in the interface between the Al$_{0.2}$Ga$_{0.8}$N electron supply layer 53 and the GaN channel layer 52 due to the piezoelectric polarization effect and the spontaneous polarization effect. Negative charge −$\sigma_{POL}$ is generated while being distributed in the AlGaN monotonically-graded composition layer 54. Positive charge +$\sigma_{DON}$ due to ionization of the n-type impurity is also generated while being distributed in the AlGaN monotonically-graded composition layer 54, and negative charge $-\sigma_{2DEG}$ is generated by the two-dimensional electron gas in the channel side hetero-interface.

Figure 6C:
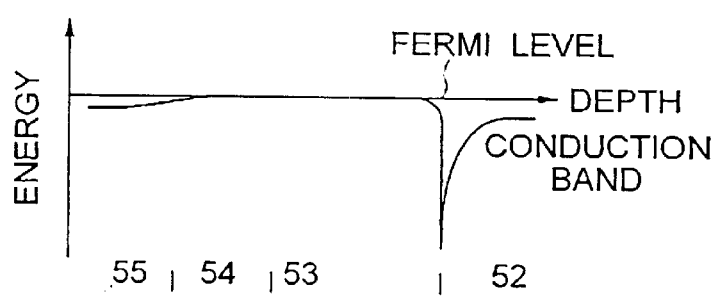
FIG. 6C shows the energy distribution in the conduction band corresponding to the graph of FIG. 6B.

Now reference is made to FIG. 6C. In this embodiment, substituting the value of Al proportion y in the AlGaN electron supply layer 53, which is 0.2, to the equation (1) yields $\sigma_{POL}/q=1.1\times10^{13}/cm^2$.

Since $\sigma_{DON}/q$ is expressed by $\sigma_{DON}/q=5.5\times10^{18}/cm^3\times22$ nm$=1.1\times10^{13}/cm^2$, the polarized negative charge $-\sigma_{POL}$ is canceled out by the ionization positive charge $+\sigma_{DON}$ in the AlGaN monotonically-graded composition layer 54 Also because the band gap changes gradually from the $Al_{0.2}Ga_{0.8}N$ layer 53 toward the GaN cap layer 55, the conduction band continues smoothly between the $Al_{0.2}Ga_{0.8}N$ electron supply layer 53 and the GaN cap layer 55. As a result, the barrier against electrons disappears so that the probability of tunneling of electrons to pass between the cap layer 55 and the channel layer 52 increases to near 1, thus causing the contact resistance between the cap layer 55 and the channel layer 52 to decrease, while decreasing the source resistance and the drain resistance.

Sixth Embodiment

Figure 7A:
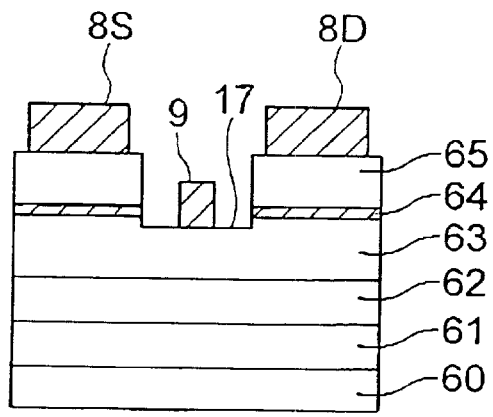
FIG. 7A schematically shows an HJFET according to a sixth embodiment of the present invention in a cross section thereof.

FIG. 7A schematically shows the HJFET of this embodiment. The HJFET has an undoped GaN buffer layer 61, an n-type GaN channel layer (n-type impurity concentration $5\times10^{17}/cm^3$, film thickness 30 nm) 62, an undoped $Al_{0.2}Ga_{0.8}N$ electron supply layer (film thickness 20 nm) 63, an n-type $Al_zGa_{1-z}N$ stepwise-graded composition layer (n-type impurity concentration $7\times10^{18}/cm^3$, 16 nm) 64, and an n-type GaN cap layer (n-type impurity concentration $5\times10^{18/cm3}$, film thickness 50 nm) 65 which are stacked sequentially on an SiC substrate 60.

The n-type AlGaN stepwise-graded composition layer 64 constitutes an intermediate layer. While AlGaN and GaN have different lattice constants, the total thickness 36 nm of the AlGaN layers (63, 64) is below the critical thickness for the occurrence of dislocation. Two-dimensional electron gas is generated in the vicinity of the interface between the GaN channel layer 62 and the AlGaN electron supply layer 63. The source electrode 8S and the drain electrode 8D are formed on the n-type GaN cap layer 65 while making an ohmic contact therewith. A gate electrode 9 is formed on the AlGaN layer 63 while making a Schottky contact therewith, in a recess 17 which is formed by removing part of the semiconductor layers 65, 64, 63.

Figure 7B:
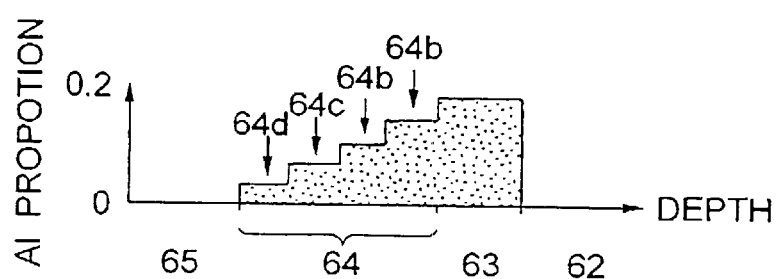
FIG. 7B shows the distribution of Al component between a cap layer and a channel layer.

As shown in FIG. 7B, the n-type AlGaN layer 64 has such a structure as $Al_{0.16}Ga_{0.84}N$ layer (n-type impurity concentration $7\times10^{18}/cm^3$, 4 nm) 64a, $Al_{0.12}Ga_{0.88}N$ layer (n-type impurity concentration $7\times10^{18}/cm^3$, 4 nm) 64b, $Al_{0.08}Ga_{0.92}N$ layer (n-type impurity concentration $7\times10^{18}/cm^3$, 4 nm) 64c and $Al_{0.04}Ga_{0.96}N$ layer (n-type impurity concentration $7\times10^{18}/cm^3$, 4 nm) 64d are stacked in this order.

The HJFET described above is manufactured by a process similar to that of the first embodiment, after growing the epitaxial layers on the (100) SiC substrate 60 by, for example, the MOVPE growing method.

Figure 7C:
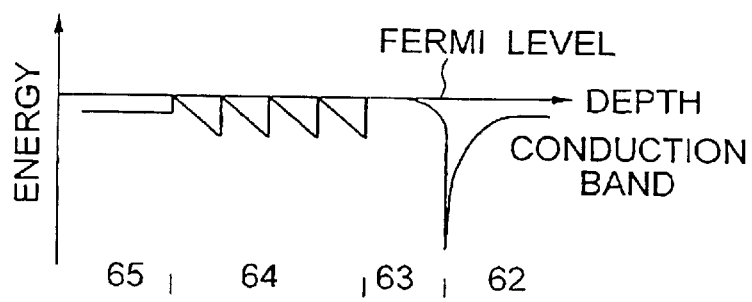
FIG. 7C shows the energy distribution in the conduction band corresponding to the graph of FIG. 7B.

Now reference is made to FIG. 7C. In this embodiment, sheet impurity concentration in the AlGaN stepwise-graded composition layer 64 is $7\times10^{18}/cm^3\times16$ nm$=1.1\times10^{13}/cm^2$ which is comparable to that in the AlGaN monotonically-graded composition layer 54 of the fifth embodiment. Thus the AlGaN stepwise-graded composition layer 64 has the effect of canceling out the polarized negative charges generated in the AlGaN stepwise-graded composition layer 64 by the ionization positive charge similarly to the AlGaN monotonically-graded composition layer 54 of the fifth embodiment.

Also because the band gap changes stepwise from the $Al_{0.2}Ga_{0.8}N$ electron supply layer 63 toward the GaN cap layer 65, the conduction band takes a saw tooth shape between the $Al_{0.2}Ga_{0.8}N$ electron supply layer 63 and the GaN cap layer 65. As a result, the barrier against electrons disappears so that the probability of tunneling of electrons to pass between the cap layer 65 and the channel layer 62 approaches to 1. Consequently, the contact resistance between the cap layer 65 and the channel layer 62 decreases, and the source resistance and the drain resistance decrease.

Seventh Embodiment

This embodiment is similar to the sixth embodiment except that the n-type AlGaN stepwise-graded composition layer 64 of the sixth embodiment is replaced by an n-type $Al_{0.2}Ga_{0.8}N$/GaN graded super lattice layer 74 (n-type impurity concentration $5.5\times10^{18}/cm^3$, film thickness 20 nm). While AlGaN and GaN have different lattice constants, the total thickness 40 nm of the AlGaN electron supply layer 63 and the super lattice layer 74 is below the critical thickness for the occurrence of dislocation.

Figure 8:
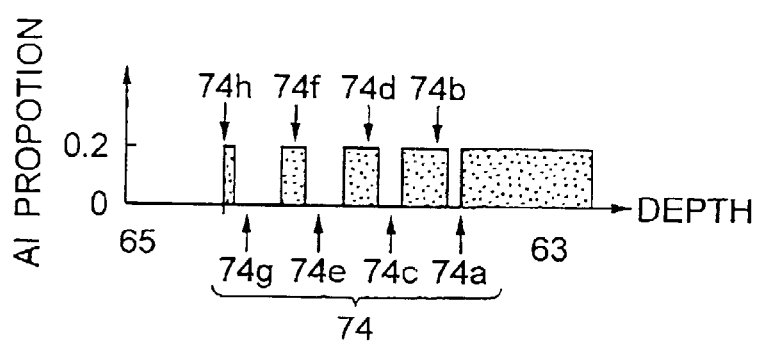
FIG. 8 shows the distribution of Al component according to a seventh embodiment of the present invention.

FIG. 8 shows the distribution of Al proportion between the cap layer 65 and the electron supply layer 63. The n-type graded super lattice layer 74 has such a structure as a GaN layer (n-type impurity concentration $5.5\times10^{18}/cm^3$, film thickness 1 nm) 74a, an $Al_{0.2}Ga_{0.8}N$ layer (n-type impurity concentration $5.5\times10^{18}/cm^3$, film thickness 4 nm) 74b, a GaN layer (n-type impurity concentration $55\times10^{18}/cm^3$, film thickness 2 nm) 74c, an $Al_{0.2}Ga_{0.8}N$ layer (n-type impurity concentration $5.5\times10^{18}/cm^3$, film thickness 3 nm) 74d, a GaN layer (n-type impurity concentration $55\times10^{18}/cm^3$, film thickness 3 nm) 74e, an $Al_{0.2}Ga_{0.8}N$ layer (n-type impurity concentration $5.5\times10^{18}/cm^3$, film thickness 2 nm) 74f, a GaN layer (n-type impurity concentration $5.5\times10^{18}/cm^3$, film thickness 4 nm) 74g, and an $Al_{0.2}Ga_{0.8}N$ layer (n-type impurity concentration $5.5\times10^{18}/cm^3$, film thickness 1 nm) 74h are stacked in this order.

In this embodiment, the graded super lattice layer 74 (intermediate layer) has such a super lattice structure as $Al_{z1}Ga_{1-z1}N$ layer ($0<z_1\leq1$) having film thickness of $t_1$ and GaN layer having film thickness of $t_2$ are stacked alternately, with the proportion $z_1$ having the same value (0.2) for all layers and the film thickness ratio $t_1/(t_1+t_2)$ decreasing from $y/z_1$ ($=0.2/0.2=1$) in the electron supply layer 63 to 0 toward the cap layer 65. The symbol y ($0<y\leq1$) denotes the proportion of Al in the electron supply layer 63. As a result, product of the proportion $z_1$ and the thickness ratio $t_1/(t_1+t_2)$ decreases from the value of the proportion y of Al ($=0.2$) in the electron supply layer 63 to 0 toward the cap layer 65.

Since the total thickness of the layers from the GaN layer 74a through the $Al_{0.2}Ga_{0.8}N$ layer 74h is 20 nm, sheet impurity concentration in the graded super lattice layer 74 is calculated as $5.5\times10^{18}/cm^3\times20$ nm$=1.1\times10^{13}/cm^2$ which is comparable to that in the n-type AlGaN stepwise-graded composition layer 64 of the sixth embodiment Thus the graded super lattice layer 74 has such an effect similar to that of the n-type AlGaN stepwise-graded composition layer 64 as the barrier against electrons disappears so that the probability of tunneling of electrons to pass between the cap layer 65 and the channel layer 62 approaches to 1.

Consequently, the contact resistance between the cap layer 65 and the channel layer 62 decreases, and the source resistance and the drain resistance decrease.

Eighth Embodiment

This embodiment is similar to the sixth embodiment except that the n-type AlGaN stepwise-graded composition layer 64 of the sixth embodiment is replaced by an n-type AlN/GaN graded super lattice layer 84 (n-type impurity concentration $3.4 \times 10^{18}/cm^3$, film thickness 32 nm). While AlGaN and GaN have different lattice constants, the total thickness 52 nm of the AlGaN layer 63 and the super lattice layer 84 is below the critical thickness for the occurrence of dislocation.

Figure 9:
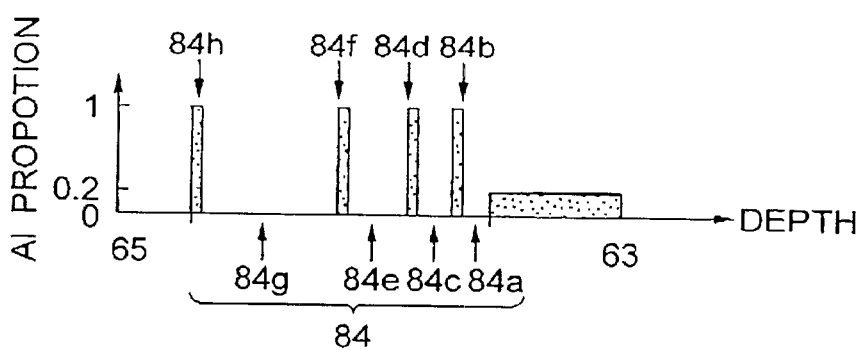
FIG. 9 shows the distribution of Al component according to an eighth embodiment of the present invention.

FIG. 9 shows the distribution of Al proportion between the cap layer 65 and the electron supply layer 63 in this embodiment. The n-type graded super lattice layer 84 has such a structure as a GaN layer (n-type impurity concentration $3.4 \times 10^{18}/cm^3$, film thickness 64 nm) 84a, an AlN layer (n-type impurity concentration $3.4 \times 10^{18}/cm^3$, film thickness 1.6 nm) 84b, a GaN layer (n-type impurity concentration $3.4 \times 10^{18}/cm^3$, film thickness 6.8 nm) 84c, an AlN layer (n-type impurity concentration $3.4 \times 10^{18}/cm^3$, film thickness 1.2 nm) 84d, a GaN layer (n-type impurity concentration $3.4 \times 10^{18}/cm^3$, film thickness 7.2 nm) 84e, an AlN layer (n-type impurity concentration $3.4 \times 10^{18}/cm^3$, film thickness 0.8 nm) 84f, a GaN layer (n-type impurity concentration $3.4 \times 10^{18}/cm^3$, film thickness 7.6 nm) 84g, and an AlN layer (n-type impurity concentration $3.4 \times 10^{18}/cm^3$, film thickness 0.4 nm) 84h are stacked in this order.

In this embodiment, the n-type AlN/GaN graded super lattice layer 84 (intermediate layer) has such a super lattice structure as $Al_{z1}Ga_{1-z1}N$ layer ($0<z_1 \leq 1$) having film thickness of $t_1$ and GaN layer having film thickness of $t_2$ are stacked alternately, with the proportion $z_1$ having the same value (1) for all layers and the film thickness ratio $t_1/(t_1+t_2)$ decreasing from $y/z_1$ (=0.2/1=0.2) in the electron supply layer 63 to 0 toward the cap layer 65. The symbol y ($0<y \leq 1$) denotes the proportion of Al in the electron supply layer 63. As a result, product of the proportion $z_1$ and the thickness ratio $t_1/(t_1+t_2)$ decreases from the value of the proportion y of Al (=0.2) in the electron supply layer 63 to 0 toward the cap layer 65.

Since the total thickness of the layers from the GaN layer 84a through the AlN layer 84h is 32 nm, sheet impurity concentration in the graded super lattice layer 84 is calculated as $$3.4 \times 10^{18}/cm^3 \times 32 \text{ nm} = 1.1 \times 10^{13}/cm^2$$

which is comparable to that of the n-type AlGaN layer 64 of the sixth embodiment which has the stepwise-graded composition. Consequently, the graded super lattice layer 84 has the effect similar to that of the seventh embodiment.

Ninth Embodiment

This embodiment is similar to the sixth embodiment except that the n-type AlGaN layer 64 of the sixth embodiment having the stepwise-graded composition is replaced by an n-type $Al_{z1}Ga_{1-z1}N$/GaN graded super lattice layer 94 (n-type impurity concentration $5.5 \times 10^{18}/cm^3$, film thickness 20 nm). While AlGaN and GaN have different lattice constants, the total thickness 40 nm of the AlGaN layer 63 and the super lattice layer 94 is below the critical thickness for the occurrence of dislocation.

Figure 10:
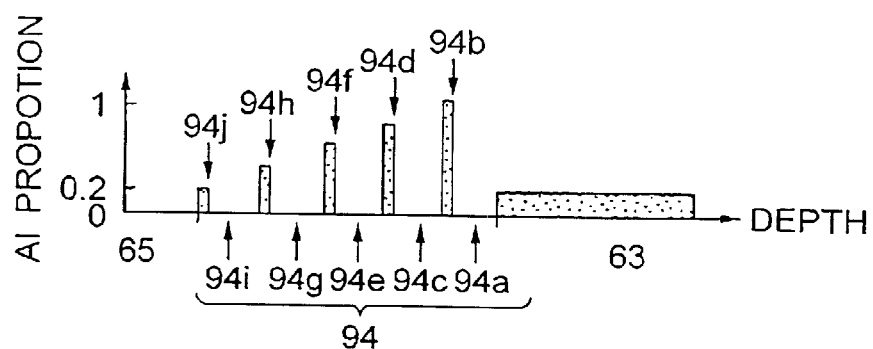
FIG. 10 shows the distribution of Al component according to a ninth embodiment of the present invention.

FIG. 10 shows the distribution of Al proportion between the cap layer 65 and the electron supply layer 63 in this embodiment. The n-type graded super lattice layer 94 has such a structure as a GaN layer (n-type impurity concentration $5.5 \times 10^{18}/cm^3$, film thickness 3.2 nm) 94a, an AlN layer (n-type impurity concentration $5.5 \times 10^{18}/cm^3$, film thickness 0.8 nm) 94b, a GaN layer (n-type impurity concentration $5.5 \times 10^{18}/cm^3$, film thickness 3.2 nm) 94c, an $Al_{0.8}Ga_{0.2}N$ layer (n-type impurity concentration $5.5 \times 10^{18}/cm^3$, film thickness 0.8 nm) 94d, a GaN layer (n-type impurity concentration $5.5 \times 10^{18}/cm^3$, film thickness 3.2 nm) 94e, an $Al_{0.6}Ga_{0.4}N$ layer (n-type impurity concentration $5.5 \times 10^{18}/cm^3$, film thickness 0.8 nm) 94f, a GaN layer (n-type impurity concentration $5.5 \times 10^{18}/cm^3$, film thickness 3.2 nm) 94g, an $Al_{0.4}Ga_{0.6}N$ layer (n-type impurity concentration $5.5 \times 10^{18}/cm^3$, film thickness 0.8 nm) 94h, a GaN layer (n-type impurity concentration $5.5 \times 10^{18}/cm^3$, film thickness 3.2 nm) 94i, and an $Al_{0.2}Ga_{0.8}N$ layer (n-type impurity concentration $5.5 \times 10^{18}/cm^3$, film thickness 0.8 nm) 94j are stacked in this order.

In this embodiment, the n-type $Al_{z1}Ga_{1-z1}N$/GaN graded super lattice layer 94 (intermediate layer) has such a super lattice structure as $Al_{z1}Ga_{z-z1}N$ layer ($0<z_1 \leq 1$) having film thickness of $t_1$ and GaN layer having film thickness of $t_2$ are stacked alternately, wherein the film thickness ratio $t_1/(t_1+t_2)$ has a constant value $\Gamma$ (=0.2), and the proportion $z_1$ decreases from $y/\Gamma$ (=0.2/0.2=1) in the electron supply layer 63 to 0 toward the cap layer 65. The symbol y ($0<y \leq 1$) denotes the proportion of Al in the electron supply layer 63. As a result, product of the proportion $z_1$ and the thickness ratio $t_1/(t_1+t_2)$ decreases from the value of the proportion y of Al (=0.2) in the electron supply layer 63 to 0 toward the cap layer 65.

Since total thickness of the layers from the GaN layer 94a through the $Al_{0.2}Ga_{0.8}N$ layer 94j is 20 nm, sheet impurity concentration in the graded super lattice layer 94 is calculated as $$5.5 \times 10^{18}/cm^3 \times 20 \text{ nm} = 1.1 \times 10^{13}/cm^2$$

which is comparable to that of the n-type AlGaN layer 64 of the sixth embodiment which has the stepwise-graded composition. Consequently, the graded super lattice layer 94 has the effect similar to that of the seventh embodiment.

Tenth Embodiment

Figure 11A:
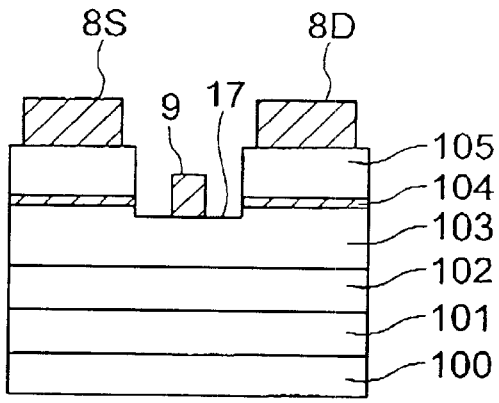
FIG. 11A schematically shows an HJFET according to a tenth embodiment of the present invention in a cross section thereof.

FIG. 11A schematically shows the HJFET of this embodiment in a sectional view. The HJFET has an undoped AlN buffer layer 101, an undoped GaN channel layer 102, an n-type $Al_{0.4}Ga_{0.6}N$ electron supply layer (n-type impurity concentration $4 \times 10^{18}/cm^3$, film thickness 20 nm) 103, an Si monoatomic layer (surface density of n-type impurity $2.2 \times 10^{13}/cm^2$) 104a, an undoped GaN layer (10 nm) 104b, an Si monoatomic layer (surface density of n-type impurity $2.2 \times 10^{13}/cm^2$) 104c and an n-type $In_{0.4}Ga_{0.6}N$ cap layer (n-type impurity concentration $5 \times 10^{19}/cm^3$, film thickness 10 nm) 105 which are stacked sequentially on a sapphire substrate 100.

The Si monoatomic layer 104a, the GaN layer 104b and the Si monoatomic layer 104c constitute an intermediate layer. While AlGaN and GaN have different lattice constants, the thickness 20 nm of the $Al_{0.4}Ga_{0.6}N$ electron supply layer 103 is below the critical thickness for the occurrence of dislocation. While InGaN and GaN also have different lattice constants, the thickness 10 nm of the $In_{0.4}Ga_{0.6}N$ cap layer 105 is below the critical thickness for the occurrence of dislocation, too. Two-dimensional electron gas is generated in the vicinity of the interface between the GaN channel layer 102 and the AlGaN electron supply layer 103. The source electrode 8S and the drain electrode 8D are formed on the n-type $In_{0.4}Ga_{0.6}N$ cap layer 105 while making an ohmic contact therewith. A gate electrode 9 is formed on the AlGaN layer 103 while making a Schottky contact therewith, in a recess 17 which is formed by removing part of the semiconductor layers 105, 104c, 104b, 104a, 103.

Thus the intermediate layer (104a, 104b, 104c) of this embodiment corresponds to the structure of stacking the first n-type impurity layer, $In_{z2}Al_{z1}Ga_{1-z1-z2}N$ layer ($0 \leq z_1 + z_2 \leq 1$) and the second n-type impurity layer wherein proportions of the components are set to $z_1 = z_2 = 0$. The cap layer 105 corresponds to $In_uGa_{1-u}N$ layer ($0 < u \leq 1$) with u being set to 0.4. This HJFET is manufactured by a process similar to that of the first embodiment, after growing the epitaxial layers on the (100) sapphire substrate 100 by, for example, the MBE growing method.

Figure 11B:
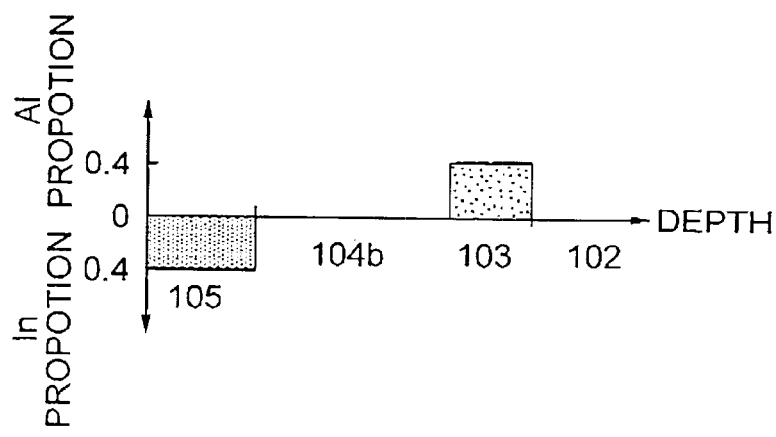
FIG. 11B shows the distributions of Al component and In component between a cap layer and a channel layer.

FIG. 11B is a graph showing the distributions of the Al and In components between the cap layer 105 and the channel layer 102 in this embodiment. In this embodiment, positive charge is generated in the interface between the GaN channel layer 102 and the $Al_{0.4}Ga_{0.6}N$ electron supply layer 103, and negative charge is generated in interface between the $Al_{0.4}Ga_{0.6}N$ electron supply layer 103 and the GaN layer 104b due to the piezoelectric polarization effect and the spontaneous polarization effect. Similarly, polarized negative charge is generated in the interface between the GaN layer 104b and the $In_{0.4}Ga_{0.6}N$ cap layer 105. Positive charge is generated due to ionization in the Si monoatomic layers 104a, 104c, and negative charge is generated by two-dimensional electron gas in the channel side hetero-interface.

Figure 11C:
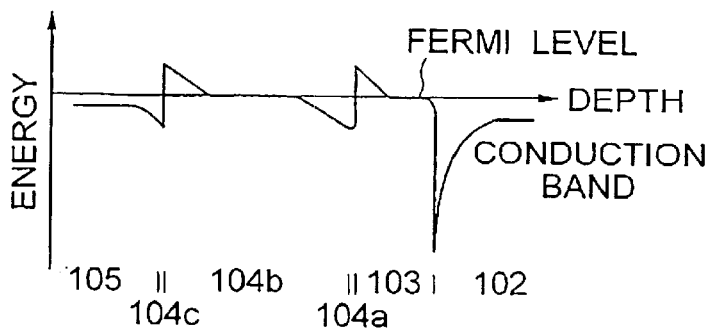
FIG. 11C shows the energy distribution in the conduction band corresponding to the graph of FIG. 11B.

FIG. 11C shows the energy distribution in the conduction band which corresponds to FIG. 10(b). In this embodiment, polarized charges can be calculated by substituting the value of Al proportion y in the AlGaN layer 103, which is 0.4, to the equation (1) as:

$$\sigma_{POL}/q = 2.2 \times 10^{13}/cm^2.$$

Since the ionized charge in the Si monoatomic layer 104a is expressed by $$\sigma_{DON}/q = 2.2 \times 10^{13}/cm^3,$$

the polarized negative charge $-\sigma_{POL}$ is canceled out by the ionized positive charge $+\sigma_{DON}$ in the hetero-interface between the AlGaN electron supply layer 103 and the GaN layer 104b. Similarly, the polarized negative charge is canceled out by the ionized positive charge also in the hetero-interface between the GaN layer 104b and the InGaN cap layer 105. As a result, the two-dimensional electron gas is generated in the hetero-interfaces, resulting in quantum well, so that the potential barrier against electrons decreases and the probability of tunneling of electrons to pass between the cap layer 105 and the channel layer 102 increases. Consequently, contact resistance between the cap layer 105 and the channel layer 102 decreases while the source resistance and the drain resistance decrease.

Since the cap layer 105 is made of InGaN which has higher electron affinity than GaN, it is made possible to decrease the potential barrier against electrons between the ohmic electrode metals (8S, 8D) and InGaN, thereby decreasing the contact resistance and achieving further lower resistance.

Eleventh Embodiment

Figure 12A:
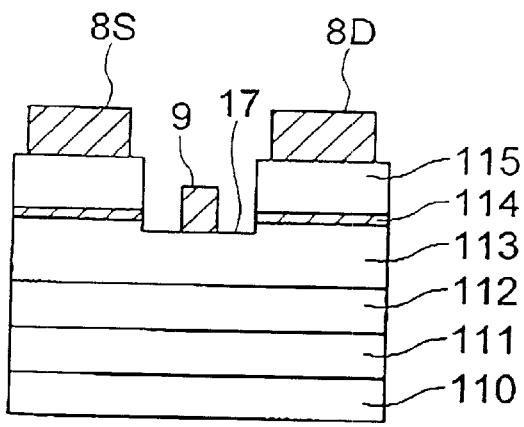
FIG. 12A schematically shows an HJFET according to an eleventh embodiment of the present invention in a cross section thereof.

FIG. 12A schematically shows the HJFET of this embodiment. The HJFET has an undoped AlN buffer layer 111, an undoped GaN channel layer 112, an n-type $Al_{0.4}Ga_{0.6}N$ electron supply layer (n-type impurity concentration $4 \times 10^{18}/cm^3$, film thickness 20 nm) 113, an n-type GaN layer (n-type impurity concentration $4.4 \times 10^{19}/cm^3$, film thickness 10 nm) 114 and an n-type $In_{0.4}Ga_{0.6}N$ cap layer (n-type impurity concentration $5 \times 10^{19}/cm^3$, film thickness 10 nm) 115 which are stacked sequentially on an SiC substrate 110.

The n-type GaN layer 114 constitutes an intermediate layer. While AlGaN and GaN have different lattice constants, the thickness 20 nm of the $Al_{0.4}Ga_{0.6}N$ layer 113 is below the critical thickness for the occurrence of dislocation. While InGaN and GaN also have different lattice constants, the thickness 10 nm of the $In_{0.4}Ga_{0.6}N$ cap layer 115 is below the critical thickness for the occurrence of dislocation, too. Two-dimensional electron gas is generated in the vicinity of the interface between the GaN channel layer 112 and the AlGaN electron supply layer 113. The source electrode 8S and the drain electrode 8D are formed on the n-type $In_{0.4}Ga_{0.6}N$ cap layer 115 while making an ohmic contact therewith. A gate electrode 9 is formed on the AlGaN layer 113 while making a Schottky contact therewith, in a recess 17 which is formed by removing part of the semiconductor layers 115, 114, 113.

Thus the intermediate layer 114 of this embodiment corresponds to n-type $In_{z2}Al_{z1}Ga_{1-z1-z2}N$ layer ($0 \leq z_1 + z_2 \leq 1$) wherein proportions of the components are set to $z_1 = z_2 = 0$. The cap layer 115 corresponds to n-type $In_uGa_{1-u}N$ layer ($0 < u \leq 1$) with u being set to 0.4. The HJFET described above is manufactured by a process similar to that of the first embodiment, after growing the epitaxial layers on the (100) SiC substrate 110 by, for example, the MOVPE growing method.

Figure 12B:
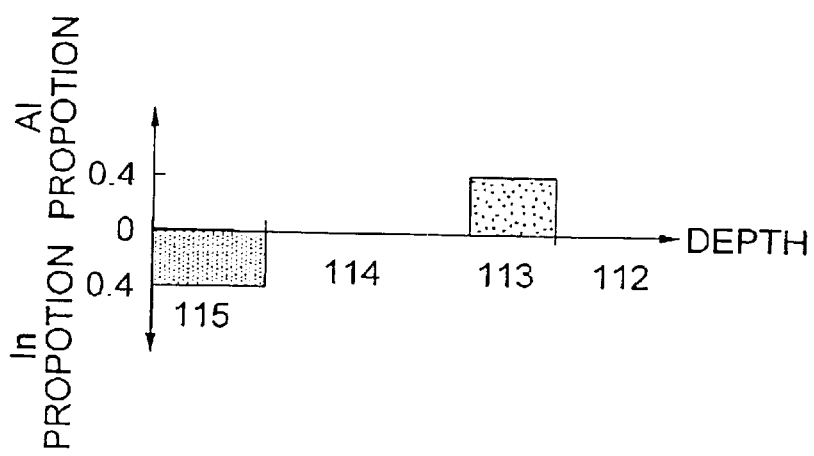
FIG. 12B shows the distributions of Al component and In component between a cap layer and a channel layer.

FIG. 12B is a graph showing the distributions of the Al and In components between the cap layer 115 and the channel layer 112 in this embodiment. In this embodiment, positive charge is generated in the interface between the GaN channel layer 112 and the $Al_{0.4}Ga_{0.6}N$ electron supply layer 113, and negative charge is generated in the interface between the $Al_{0.4}Ga_{0.6}N$ electron supply layer 113 and the GaN layer 114 due to the piezoelectric polarization effect and the spontaneous polarization effect. Similarly, polarized negative charge is generated in the interface between the GaN layer 114 and the $In_{0.4}Ga_{0.6}N$ cap layer 115. Ionization positive charge is generated in the n-type GaN layer 114, and negative charge is generated by the two-dimensional electron gas in the channel side hetero-interface.

Figure 12C:
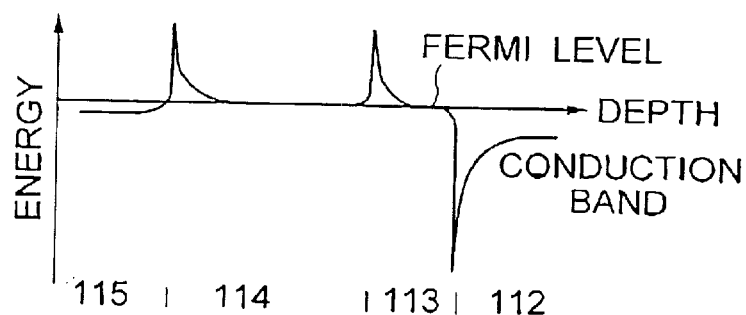
FIG. 12C shows the energy distribution in the conduction band corresponding to the graph of FIG. 12B.

Now reference is made to FIG. 12C. In this embodiment, polarization charge can be calculated by substituting the value of Al proportion y in the AlGaN electron supply layer 113, which is 0.4, to the equation (1) as:

$$\sigma_{POL}/q = 2.2 \times 10^{13}/cm^2.$$

Since the ionization charge in the n-type GaN layer 114 is expressed by $$\sigma_{DON}/q = 4.4 \times 10^{19}/cm^3 \times 10 \text{ nm} = 4.4 \times 10^{13}/cm^2,$$

the polarized negative charge $-\sigma_{POL}$ is canceled out by a part of the ionized positive charge $+\sigma_{DON}$ in the hetero-interface between the AlGaN electron supply layer 113 and the GaN layer 114. Similarly, the polarized negative charge is canceled out by a part of the ionized positive charge $+\sigma_{DON}$ also in the hetero-interface between the GaN layer 114 and the InGaN cap layer 115.

As a result, thickness of the depletion layer decreases to 10 nm which is the thickness of the GaN layer 114 or less, so that the probability of tunneling of electrons to pass between the cap layer 115 and the channel layer 112 increases. Consequently, contact resistance between the cap layer 115 and the channel layer 112 decreases while the source resistance and the drain resistance decrease. Also because $In_{0.4}Ga_{0.6}N$ has higher electron affinity than GaN, contact resistance between the InGaN layer 115 and the ohmic electrodes (8S, 8D) decreases, thereby decreasing the source resistance and the drain resistance, too.

Twelfth Embodiment

Figure 13A:
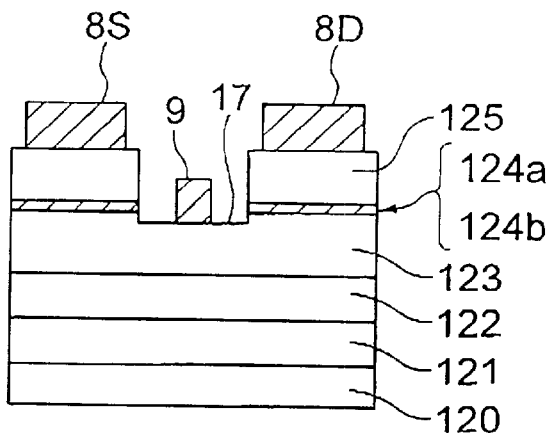
FIG. 13A schematically shows an HJFET according to a twelfth embodiment of the present invention in a cross section thereof.

FIG. 13A schematically shows the HJFET of this embodiment. The HJFET has an undoped GaN buffer layer 121, an n-type GaN channel layer (n-type impurity concentration $5 \times 10^{17}/cm^3$, film thickness 30 nm) 122, an undoped $Al_{0.4}Ga_{0.6}N$ electron supply layer (film thickness 20 nm) 123, an n-type $Al_{z1}Ga_{1-z1}N$ graded composition layer (proportion of Al component $z_1$:0.4→0, n-type impurity concentration $4.5 \times 10^{19}/cm^3$, film thickness 5 nm) 124a, an n-type $In_{z2}Ga_{1-z2}N$ graded composition layer (proportion of In component $Z_2$:0→0.4, n-type impurity concentration $4.4 \times 10^{19}/cm^3$, film thickness 5 nm) 124b and an n-type $In_{0.4}Ga_{0.6}N$ cap layer (n-type impurity concentration $5 \times 10^{19}/cm^3$, film thickness 10 nm) 125, which are stacked sequentially on a sapphire substrate 120. The proportion of Al component $z_1$ is in a range of $0 < z_1 \leq 1$ and the proportion of In component $z_2$ is also in a range of $0 < z_2 \leq 1$ but in this case changes between 0.4 and 0 as described above.

The n-type AlGaN monotonically-graded composition layer 124a and the n-type InGaN graded composition layer 124b constitute an intermediate layer. While AlGaN and GaN have different lattice constants, the total thickness 25 nm of the AlGaN layers (123, 124a) is below the critical thickness for the occurrence of dislocation. While InGaN and GaN also have different lattice constants, the total thickness 15 nm of the InGaN layers (124b, 125) is below the critical thickness for the occurrence of dislocation, too. Two-dimensional electron gas is generated in the vicinity of the interface between the GaN layer 122 and the AlGaN layer 123. The source electrode 8S and the drain electrode 8D are formed on the n-type $In_{0.4}Ga_{0.6}N$ cap layer 125 while making an ohmic contact therewith. A gate electrode 9 is formed on the AlGaN layer 123 while making an ohmic contact therewith, in a recess 17 which is formed by removing part of the semiconductor layers 125, 124b, 124a, 123.

The HJFET described above is manufactured by a process similar to that of the first embodiment, after growing the epitaxial layers on the (100) sapphire substrate 120 by, for example, the MBE growing method.

Figure 13B:
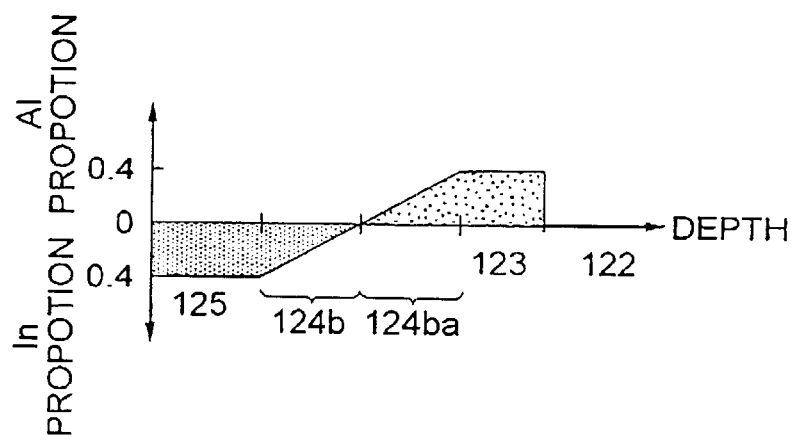
FIG. 13B shows the distributions of Al component and In component between a cap layer and a channel layer.

In the HJFET of this embodiment, as shown in FIG. 13B, the intermediate layer has the $Al_{z1}Ga_{1-z1}N$ layer ($0 < z_1 \leq y$) 124a and the $In_{z2}Ga_{1-z2}N$ layer ($0 < z_2 \leq u$) 124b stacked sequentially, wherein proportion $z_1$ changes from y (=0.4) in the electron supply layer 123 to 0 toward the $In_{z2}Ga_{1-z2}N$ layer 124b, and proportion z changes from 0 in the $Al_{z1}Ga_{1-z1}N$ layer 124a to u (=0.4) toward the cap layer 125. The symbol y ($0 < y \leq 1$) denotes the proportion of Al component in the electron supply layer 123 and u ($0 < u \leq 1$) denotes the proportion of In component in the cap layer 125. As a result, difference ($z_1 - z_2$) of the proportion $z_1$ of Al component and the proportion $z_2$ of In component in the intermediate layer changes from the value of y (=0.4) in the electron supply layer 123 to $-u$ (=$-0.4$) toward the cap layer 125.

In this embodiment, positive charge is generated in the interface between the $Al_{0.4}Ga_{0.6}N$ electron supply layer 123 and the GaN channel layer 122, and negative charge is generated in the AlGaN monotonically-graded composition layer 124a due to the piezoelectric polarization effect and the spontaneous polarization effect. Similarly, polarized negative charge is generated while being distributed in the InGaN graded composition layer 124b. Ionization positive charge is generated while being distributed in the n-type AlGaN monotonically-graded composition layer 124a and in the InlGaN graded composition layer 124b, and negative charge is generated by the two-dimensional electron gas in the channel side hetero-interface.

Figure 13C:
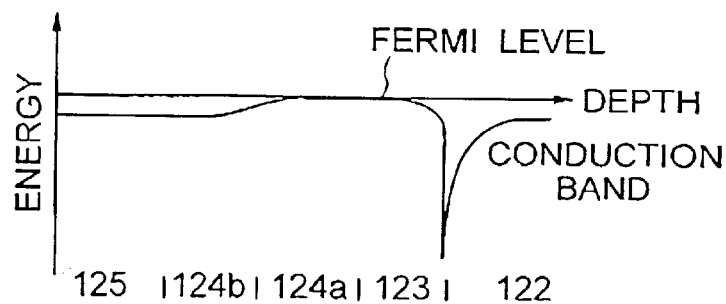
FIG. 13C shows the energy distribution in the conduction band corresponding to the graph of FIG. 13B.

Now reference is made to FIG. 13C. In this embodiment, the polarized charge can be calculated by substituting the value of Al proportion y in the AlGaN layer 123, which is 0.4, to the equation (1) as:

$$\sigma_{POL}/q = 2.2 \times 10^{13}/cm^2.$$

Since the ionization charge in the n-type AlGaN monotonically-graded composition layer 124a is expressed by $$\sigma_{DON}/q = 4.4 \times 10^{19}/cm^3 \times 5\ nm = 2.2 \times 10^{13}/cm^2,$$

the polarized negative charge is canceled out by the ionization positive charge in the AlGaN monotonically-graded composition layer 124a. Similarly, the polarized negative charge is canceled out by the ionization positive charge also in the n-type InAlGaN monotonically-graded composition layer 124b.

Also because the band gap changes gradually from the $In_{0.4}Ga_{0.6}N$ cap layer 125 toward the $Al_{0.4}Ga_{0.6}N$ electron supply layer 123, the conduction band continues smoothly between the $In_{0.4}Ga_{0.6}N$ cap layer 125 and the $Al_{0.4}Ga_{0.6}N$ electron supply layer 123. As a result, the barrier against electrons disappears so that the probability of tunneling of electrons to pass between the cap layer 125 and the channel layer 122 approaches to 1, thus causing the contact resistance between the cap layer 125 and the channel layer 122 to decrease, while decreasing the source resistance and the drain resistance. Also because $In_{0.4}Ga_{0.6}N$ has higher electron affinity than GaN, contact resistance between the InGaN layer 125 and the ohmic electrodes (8S, 8D) decreases, thereby decreasing the source resistance and the drain resistance.

Thirteenth Embodiment

Figure 14A:
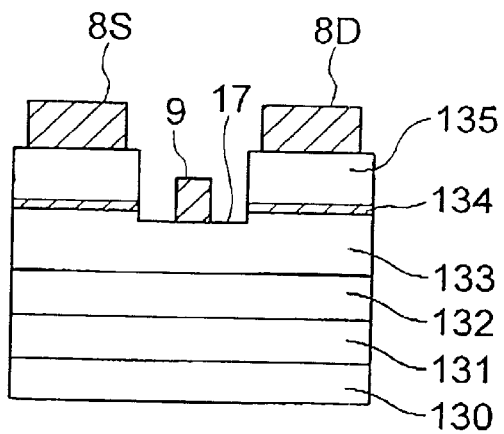
FIG. 14A schematically shows an HJFET according to a thirteenth embodiment of the present invention in a cross section thereof.

FIG. 14A schematically shows the HJFET of this embodiment. The HJFET has an undoped GaN buffer layer 131, an n-type GaN channel layer (n-type impurity concentration $5 \times 10^{17}/cm^3$, film thickness 30 nm) 132, an undoped $Al_{0.4}Ga_{0.6}N$ electron supply layer (film thickness 20 nm) 133, an n-type $In_{0.4-z}Al_zGa_{0.6}N$ graded composition layer (z=0.4→0, n-type impurity concentration $4.4 \times 10^{19}/cm^3$, film thickness 10 nm) 134 and an n-type $In_{0.4}Ga_{0.6}N$ cap layer (n-type impurity concentration $5 \times 10^{19}/cm^3$, film thickness 10 nm) 135, which are stacked sequentially on an SiC substrate 130.

The n-type InAlGaN monotonically-graded composition layer 134 is n-type $In_{z2}Al_{z1}Ga_{1-z1-z2}N$ layer ($0 < z_1 + z_2 \leq 1$) and constitutes an intermediate layer. While AlGaN and GaN have different lattice constants, the thickness 20 nm of the $Al_{0.4}Ga_{0.6}N$ layer 133 is below the critical thickness for the occurrence of dislocation. While InGaN and GaN also have different lattice constants, the thickness 10 nm of the $In_{0.4}Ga_{0.6}N$ layer 135 is below the critical thickness for the occurrence of dislocation, too. Two-dimensional electron gas is generated in the vicinity of the interface between the GaN layer 132 and the AlGaN layer 133. The source electrode 8S and the drain electrode 8D are formed on the n-type $In_{0.4}Ga_{0.6}N$ cap layer 135 while making an ohmic contact therewith. A gate electrode 9 is formed on the AlGaN layer 133 while making a Schottky contact therewith, in a recess 17 which is formed by removing part of the semiconductor layers 135, 134, 133.

The HJFET described above is manufactured by a process similar to that of the first embodiment, after growing the epitaxial layers on the (100) SiC substrate 130 by, for example, the MOVPE growing method.

Figure 14B:
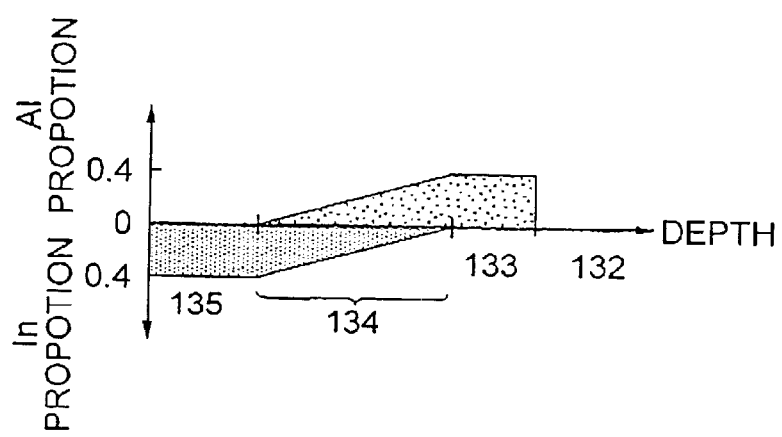
FIG. 14B shows the distributions of Al component and In component between a cap layer and a channel layer.

In the HJFET of this embodiment, as shown in FIG. 14B, proportion of Al component $z_1$ in the n-type $In_{z2}Al_{z1}Ga_{1-z1-z2}N$ intermediate layer 134 changes from y (=0.4) in the electron supply layer 133 to 0 toward the cap layer 135, and proportion of In component $Z_2$ changes from 0 to u (=0.4). The symbol y ($0<y\leq1$) denotes the proportion of Al component in the electron supply layer 133 and u ($0<u\leq1$) denotes the proportion of In component in the cap layer 135. As a result, difference ($z_1-z_2$) of the proportion $z_1$ of Al component and the proportion $z_2$ of In component in the intermediate layer changes from the value of y (=0.4) in the electron supply layer 133 to −u (=−0.4) toward the cap layer 135.

In this embodiment, positive charge is generated in the interface between the $Al_{0.4}Ga_{0.6}N$ electron supply layer 133 and the GaN channel layer 132, and negative charge is generated in the InAlGaN monotonically-graded composition layer 134 due to the piezoelectric polarization effect and the spontaneous polarization effect. Ionization positive charge is generated in the n-type InAlGaN monotonically-graded composition layer 134 and negative charge is generated by the two-dimensional electron gas in the channel side hetero-interface.

Figure 14C:
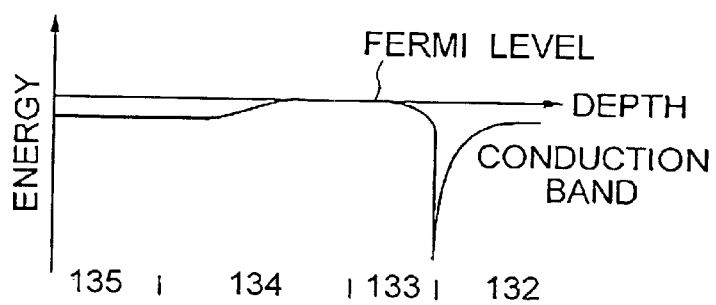
FIG. 14C shows the energy distribution in the conduction band corresponding to the graph of FIG. 14B.

Now reference is made to FIG. 14C. In this embodiment, sheet impurity concentration in the InAlGaN monotonically-graded composition layer 134 is $$4.4\times10^{19}/cm^3 \times 10\ nm = 4.4\times10^{13}/cm^2,$$

which is comparable to that in the graded composition layers (124a, 124b) of the twelfth embodiment. Thus in the InAlGaN monotonically-graded composition layer 134, the polarized negative charge in the layer is canceled out by the ionization charge similarly to the graded composition layers (124a, 124b) of the twelfth embodiment.

Also because the band gap changes gradually from the $In_{0.4}Ga_{0.6}N$ layer 135 toward the $Al_{0.4}Ga_{0.6}N$ layer 133, the conduction band continues smoothly between the $In_{0.4}Ga_{0.6}N$ layer 135 and the $Al_{0.4}Ga_{0.6}N$ layer 133. As a result, the barrier against electrons disappears so that the probability of tunneling of electrons to pass between the cap layer 135 and the channel layer 132 approaches to 1, thus achieving the effect similar to that of the twelfth embodiment.

In all of the first through thirteenth embodiments described above, In is not included in the channel layer, namely proportion of In component is 0. Now examples where the channel layer includes In will be described in the fourteenth and the subsequent embodiments Fourteenth Embodiment This embodiment is similar to the first embodiment except that the undoped GaN channel layer 12 of the first embodiment is replaced by an undoped $In_{0.1}Ga_{0.9}N$ channel layer (20 nm) 142. While InGaN and GaN have different lattice constants, the thickness 20 nm of the $In_{0.1}Ga_{0.9}N$ channel layer 142 is below the critical thickness for the occurrence of dislocation.

Figure 15:
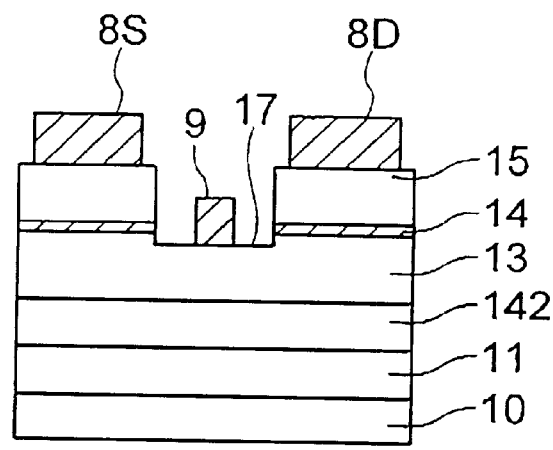
FIG. 15 schematically shows an HJFET according to a fourteenth embodiment of the present invention.

FIG. 15 is a sectional view of the HJFET of this embodiment. In this embodiment, contact resistance between the cap layer 15 and the channel layer 142 decreases, thereby decreasing the source resistance and the drain resistance, similarly to the first embodiment. Also because the effective mass of electron is smaller and the electron mobility is higher in the $In_{0.1}Ga_{0.9}N$ used as the channel layer than in GaN, high-frequency performance is improved.

Fifteenth Embodiment

This embodiment is similar to the second embodiment except that the n-type GaN channel layer 22 of the second embodiment is replaced by an n-type $In_{0.1}Ga_{0.9}N$ channel layer (n-type impurity concentration $1\times10^{18}/cm^3$, film thickness 20 nm) 152. While InGaN and GaN have different lattice constants, the film thickness 20 nm of the $In_{0.1}Ga_{0.9}N$ layer 152 is below the critical thickness for the occurrence of dislocation.

Figure 16:
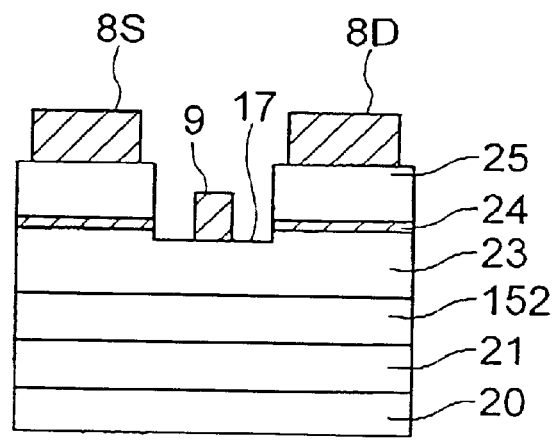
FIG. 16 schematically shows an HJFET according to a fifteenth embodiment of the present invention.

FIG. 16 is a sectional view of the HJFET of this embodiment. In this embodiment, contact resistance between the cap layer 25 and the channel layer 152 decreases, thereby decreasing the source resistance and the drain resistance, similarly to the second embodiment. Also the $In_{0.1}Ga_{0.9}N$ used for the channel achieves the effect similar to that described above.

Sixteenth Embodiment

This embodiment is similar to the third embodiment except that the undoped GaN channel layer 32 of the third embodiment is replaced by an undoped $In_{0.1}Ga_{0.9}N$ channel layer (20 nm) 162. While InGaN and GaN have different lattice constants, the film thickness 20 nm of the $In_{0.1}Ga_{0.9}N$ layer 162 is below the critical thickness for the occurrence of dislocation.

Figure 17:
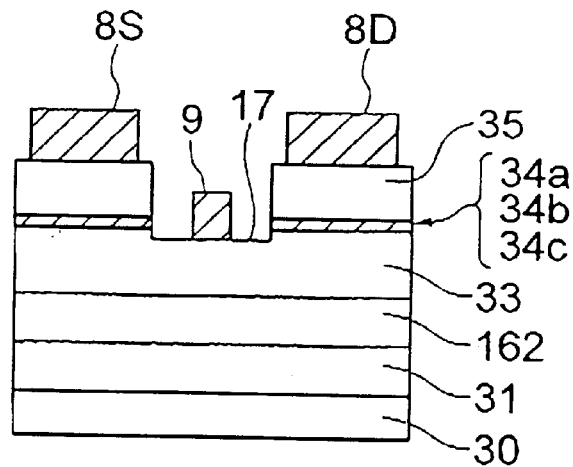
FIG. 17 schematically shows an HJFET according to a sixteenth embodiment of the present invention.

FIG. 17 is a sectional view of the HJFET of this embodiment. In this HJFET, the intermediate layer has a first n-type impurity layer 34a, $In_{z2}Al_{z1}Ga_{1-z1-z2}N$ ($0\leq z_1+z_2\leq 1$) 34b and a second n-type impurity layer 34c which are formed sequentially. In this embodiment, contact resistance between the cap layer 35 and the channel layer 162 decreases, thereby decreasing the source resistance and the drain resistance, similarly to the third embodiment. Also the $In_{0.1}Ga_{0.9}N$ used for the channel achieves the effect similar to that described above.

Seventeenth Embodiment

This embodiment is similar to the fourth embodiment except that the n-type GaN channel layer 42 of the fourth embodiment is replaced by an n-type $In_{0.1}Ga_{0.9}N$ channel layer (n-type impurity concentration $1\times10^{18}/cm^3$, film thickness 20 nm) 172. While InGaN and GaN have different lattice constants, the film thickness 20 nm of the $In_{0.1}Ga_{0.9}N$ layer 172 is below the critical thickness for the occurrence of dislocation.

Figure 18:
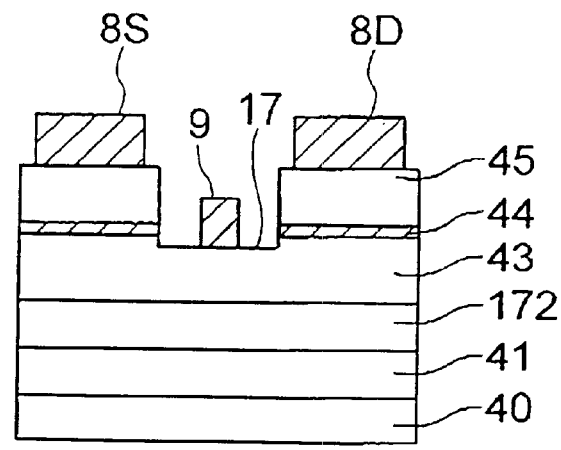
FIG. 18 schematically shows an HJFET according to a seventeenth embodiment of the present invention.

FIG. 18 is a sectional view of the HJFET of this embodiment. In this embodiment, contact resistance between the cap layer 45 and the channel layer 172 decreases, thereby decreasing the source resistance and the drain resistance, similarly to the fourth embodiment. Also the $In_{0.1}Ga_{0.9}N$ used for the channel achieves the effect similar to that described above.

Eighteenth Embodiment

This embodiment is similar to the tenth embodiment except that the undoped GaN channel layer 102 of the tenth embodiment is replaced by an undoped $In_{0.2}Ga_{0.8}N$ channel layer (10 nm) 182. While InGaN and GaN have different lattice constants, the film thickness 10 nm of the $In_{0.2}Ga_{0.8}N$ layer 182 is below the critical thickness for the occurrence of dislocation.

Figure 19:
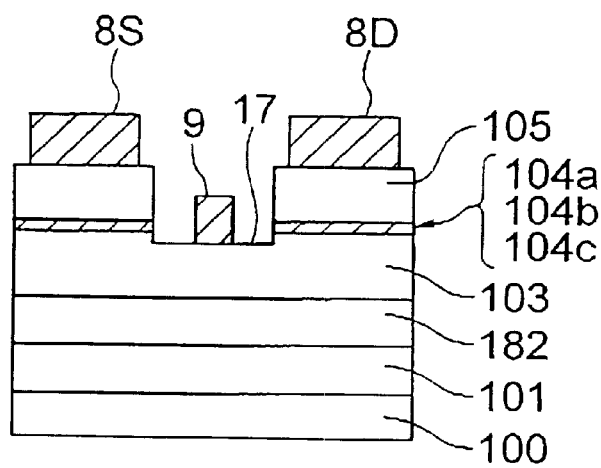
FIG. 19 schematically shows an HJFET according to an eighteenth embodiment of the present invention.

FIG. 19 is a sectional view of the HJFET of this embodiment. In this embodiment, contact resistance between the cap layer 105 and the channel layer 182 decreases, thereby decreasing the source resistance and the drain resistance, similarly to the tenth embodiment Also the $In_{0.2}Ga_{0.8}N$ used for the channel achieves the effect similar to that described above.

Nineteenth Embodiment

This embodiment is similar to the eleventh embodiment except that the undoped GaN channel layer 112 of the eleventh embodiment is replaced by an undoped $In_{0.2}Ga_{0.8}N$ channel layer (10 nm) 192. While InGaN and GaN have different lattice constants, the film thickness 10 mn of the $In_{0.2}Ga_{0.8}N$ layer 192 is below the critical thickness for the occurrence of dislocation.

Figure 20:
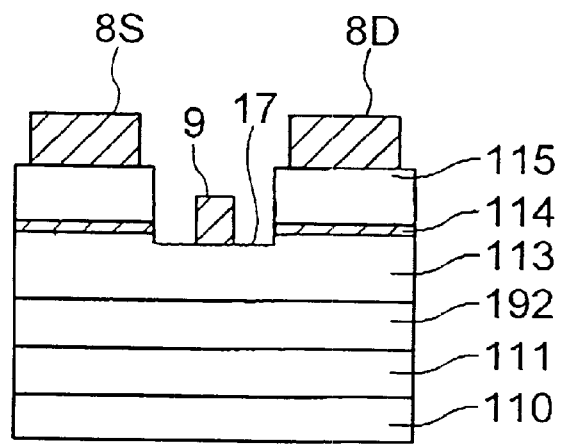
FIG. 20 schematically shows an HJFET according to a nineteenth embodiment of the present invention.

FIG. 20 is a sectional view of the HJFET of this embodiment. In this embodiment, contact resistance between the cap layer 115 and the channel layer 192 decreases, thereby decreasing the source resistance and the drain resistance, similarly to the eleventh embodiment. Also the $In_{0.2}Ga_{0.8}N$ used for the channel achieves the effect similar to that described above.

While the present invention is described by way of preferred embodiments thereof, the hetero-junction field effect transistor of the present invention is not limited to the constitutions of the embodiments described above, and hetero-junction field effect transistors having constitutions modified or altered from the constitutions of the embodiments described above also fall within the scope of the present invention.

As described above, the hetero-junction field effect transistor of the present invention has an effect of decreasing the source resistance and the drain resistance and achieving higher output power and excellent noise characteristic.

Since the above embodiments are described only for examples, the present invention is not limited to the above embodiments and various modifications or alterations can be easily made therefrom by those skilled in the art without departing from the scope of the present invention.

What is claimed is:

1. A hetero-junction filed effect transistor (HJFET) comprising a substrate, a layer structure including an $In_xGa_{1-x}N$ ($0 \leq x \leq 1$) channel layer, an $Al_yGa_{1-y}N$ ($0<y \leq 1$) electron supply layer, at least one intermediate layer and an n-type GaN cap layer consecutively formed on said substrate, a gate electrode disposed in contact with said electron supply layer, and source and drain electrodes disposed in contact with said n-type cal layer, said at least one intermediate layer being formed as a single n-type-impurity doped layer or a plurality of stacked layers including at least one n-type-impurity doped layer, wherein said n-type-impurity doped layer includes n-type impurities in a surface density (Ns cm$^{-2}$) expressed by:

$$Ns > 3.9 \times 10^{12} Xy^2 + 1.7 \times 10^{13} Xy.$$

2. The HJFET as defined in claim 1, wherein said n-type-impurity doped layer is an n-type $Al_zGa_{1-z}N$ (z=y) layer.

3. The HJFET as defined in claim 1, wherein said plurality of stacked layers include a first n-type-impurity doped layer, an $Al_zGa_{1-z}N$ ($0<z<y$) layer and a second n-type-impurity doped layer consecutively formed on said electron supply layer.

4. The HJFET as defined in claim 3, wherein said $Al_zGa_{1-z}N$ layer has a graded composition, given z gradually decreasing from y toward zero as viewed from said electron supply layer toward said n-type cap layer.

5. The HJFET as defined in claim 3, wherein said $Al_zGa_{1-z}N$ layer has a graded composition, given z stepwise decreasing from y toward zero as viewed from said electron supply layer toward said n-type cap layer.

6. The HJFET as defined in claim 1, wherein said n-type-impurity doped layer is an n-type $Al_zGa_{1-z}N$ ($0<z<y$) layer.

7. The HJFET as defined in claim 6, wherein said $Al_zGa_{1-z}N$ layer has a graded composition, given z gradually decreasing from y toward zero as viewed from said electron supply layer toward said n-type cap layer.

8. The HJFET as defined in claim 6, wherein said $Al_zGa_{1-z}N$ layer has a graded composition, given z stepwise decreasing from y toward zero as viewed from said electron supply layer toward said n-type cap layer.

9. The HJFET as claimed in claim 1, wherein said at least one intermediate layer has a super-lattice structure including a plurality of $Al_{z1}Ga_{1-z1}N$ ($0<z1 \leq 1$) layers and a plurality of GaN layers alternately stacked, each of said $Al_{z1}Ga_{1-z1}N$ layers and each of said GaN layers having a thickness of t1 and t2, respectively, $z1 \times t1/(t1+t2)$ monotonically decreasing from y toward zero as viewed from said electron supply layer toward said n-type cap layer.

10. The HJFET as defined in claim 1, wherein said at least one intermediate layer has a super-lattice structure including a plurality $Al_{z1}Ga_{1-z1}N$ ($0<z1 \leq 1$) layers and a plurality of GaN layers alternately stacked, each of said $Al_{z1}Ga_{1-z1}N$ layers and each of said GaN layers having a thicknesses of t1 and t2, respectively, z1 being constant and $t1/(t1+t2)$ monotonically decreasing from y/z1 toward zero as viewed from said electron supply layer toward said n-type cap layer.

11. The HJFET as defined in claim 1, wherein said at least one intermediate layer has a super-lattice structure including a plurality $Al_{z1}Ga_{1-z1}N$ ($0<z1 \leq 1$) layers and a plurality of GaN layers alternately stacked, each of said $Al_{z1}Ga_{1-z1}N$ layers and each of said GaN layers having a thicknesses of t1 and t2, respectively, $t1/(t1+t2)$ assuming a constant Γ and z1 monotonically decreasing from y/Γ toward zero as viewed from said electron supply layer toward said n-type cap layer.

12. A hetero-junction filed effect transistor (HJFET) comprising a substrate, a layer structure including an $In_xGa_{1-x}N$ ($0 \leq x \leq 1$) channel layer, an $Al_yGa_{1-y}N$ ($0<y<1$) electron supply layer, at least one intermediate layer and an n-type $In_uGa_{1-u}N$ cap layer consecutively formed on said substrate, a gate electrode disposed in contact with said electron supply layer, and source and drain electrodes disposed in contact with said n-type cap layer, said at least one intermediate layer being formed as a single n-type-impurity doped layer or a plurality of stacked layers including at least one n-type-impurity doped layer, wherein said n-type-impurity doped layer includes n-type impurities in a surface density (Ns) expressed by $$Ns(cm^{-2}) > 3.9 \times 10^{12} Xy^2 + 1.7 \times 10^{13} Xy.$$

13. The HJFET as defined in claim 12, wherein said plurality of stacked layers include a first n-type-impurity doped layer, an $In_{z2}Al_{z1}Ga_{1-z1-z2}N$ ($0 \leq z1+z2 \leq 1$) layer and a second n-type-impurity doped layer consecutively formed on said electron supply layer.

14. The HJFET as defined in claim 13, wherein said $In_{z2}Al_{z1}Ga_{1-z1-z2}2N (0 \leq z1+z2 \leq 1)$ layer has a graded composition, z1–z2 monotonically decreasing from y toward –u as viewed from said electron supply layer toward said n-type cap layer.

15. The HJFET as defined in claim 14, wherein z1 decreases from y toward zero and z2 increases from zero toward u, as viewed from said electron supply layer toward said n-type cap layer.

16. The HJFET as defined in claim 14, wherein said stacked layers include a plurality of $Al_{z1}Ga_{1-z1}N$ ($0 \leq z1 \leq y$) layers and a plurality of $In_{z2}Ga_{1-z2}N$ ($0 \leq z2 \leq u$) layers stacked alternately, given z1 decreasing from y toward zero as viewed from said electron supply layer toward $In_{z2}Ga_{1-z2}N$ layer, given z2 increasing from zero toward u as viewed from said $In_{z2}Ga_{1-z2}N$ layer toward said n-type cap layer.

17. The HJFET as defined in claim 12, wherein said n-type-impurity doped layer is an n-type $In_{z2}Al_{z1}Ga_{1-z1-z2}N$ ($0 \leq z1+z2 \leq 1$) layer.

18. The HJFET as defined in claim 17, wherein said $In_{z2}Al_{z1}Ga_{1-z1-z2}2N$ ($0 \leq z1+z2 \leq 1$) layer has a graded composition, z1–z2 monotonically decreasing from y toward –u as viewed from said electron supply layer toward said n-type cap layer.

19. The HJFET as defined in claim 18, wherein z1 decreases from y toward zero and z2 increases from zero toward u, as viewed from said electron supply layer toward said n-type cap layer.

20. The HJFET as defined in claim 18, wherein said stacked layers include a plurality of $Al_{z1}Ga_{1-z1}N$ ($0 \leq z1 \leq y$) layers and a plurality of $In_{z2}Ga_{1-z2}N$ ($0 \leq z2 \leq u$) layers stacked alternately, given z1 decreasing from y toward zero as viewed from said electron supply layer toward $In_{z2}Ga_{1-z2}N$ layer, given z2 increasing from zero toward u as viewed from said $In_{z2}Ga_{1-z2}N$ layer toward said n-type cap layer.

\* \* \* \* \*